(12) United States Patent
Grivna

(10) Patent No.: US 11,380,788 B2
(45) Date of Patent: Jul. 5, 2022

(54) STRUCTURES AND METHODS FOR SOURCE-DOWN VERTICAL SEMICONDUCTOR DEVICE

(71) Applicant: SEMICONDUCTOR COMPONENTS INDUSTRIES, LLC, Phoenix, AZ (US)

(72) Inventor: Gordon M. Grivna, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 52 days.

(21) Appl. No.: 16/948,880

(22) Filed: Oct. 5, 2020

(65) Prior Publication Data

US 2021/0296482 A1    Sep. 23, 2021

Related U.S. Application Data

(60) Provisional application No. 62/993,389, filed on Mar. 23, 2020.

(51) Int. Cl.
| | |
|---|---|
| *H01L 29/78* | (2006.01) |
| *H01L 21/78* | (2006.01) |
| *H01L 29/06* | (2006.01) |
| *H01L 23/48* | (2006.01) |
| *H01L 21/3065* | (2006.01) |

(52) U.S. Cl.
CPC ........... *H01L 29/781* (2013.01); *H01L 21/78* (2013.01); *H01L 23/481* (2013.01); *H01L 29/0649* (2013.01); *H01L 29/7813* (2013.01); *H01L 21/30655* (2013.01); *H01L 29/7811* (2013.01)

(58) Field of Classification Search
CPC ..... H01L 29/781; H01L 21/78; H01L 23/481; H01L 29/0649; H01L 29/7813; H01L 21/30655; H01L 29/7811
USPC .......................................... 257/312; 438/270
See application file for complete search history.

(56) References Cited

U.S. PATENT DOCUMENTS

| | | |
|---|---|---|
| 8,981,533 B2 | 5/2015 | Grivna |
| 2010/0090668 A1 | 4/2010 | Girdhar et al. |
| 2013/0043526 A1 | 2/2013 | Iyer et al. |
| 2016/0268245 A1* | 9/2016 | Chen et al. ......... H01L 27/0248 438/270 |
| 2018/0138319 A1 | 5/2018 | Salih et al. |

* cited by examiner

*Primary Examiner* — Thinh T Nguyen
(74) *Attorney, Agent, or Firm* — Kevin B. Jackson

(57) ABSTRACT

A semiconductor device includes a region of semiconductor material having a first side and a second side opposite to the first side. Active device structures are adjacent to the first side, the active device structures comprising source regions and gate electrodes. A first gate conductor is at the first side electrically connected to the gate electrodes, a drain region is at the second side, a second gate conductor is at the second side, and through-semiconductor vias extending from the first side towards the side and electrically connecting the first gate electrode to the second gate electrode. A source electrode is at the first side electrically connected to the source regions, and a drain electrode is at the second side electrically connected to the drain region. The through-semiconductor vias are electrically isolated from the source regions and the drain region. The structure provides a gate/drain up with a source-down configuration.

11 Claims, 19 Drawing Sheets

STRUCTURES AND METHODS FOR SOURCE-DOWN VERTICAL SEMICONDUCTOR DEVICE

CROSS-REFERENCE TO RELATED APPLICATIONS

This application claims priority from U.S. Provisional Patent Application No. 62/993,389 filed on Mar. 23, 2020, which is hereby incorporated by reference in its entirety.

TECHNICAL FIELD

The present disclosure relates, in general, to electronics and, more particularly, to semiconductor device structures and methods of forming semiconductor devices.

BACKGROUND

Prior semiconductor devices and methods for forming semiconductor devices are inadequate, for example resulting in excess cost, inadequate integration, decreased reliability, relatively low performance, or dimensions that are too large. Further limitations and disadvantages of conventional and traditional approaches will become apparent to one of skill in the art, through comparison of such approaches with the present disclosure and reference to the drawings.

Figure 1:
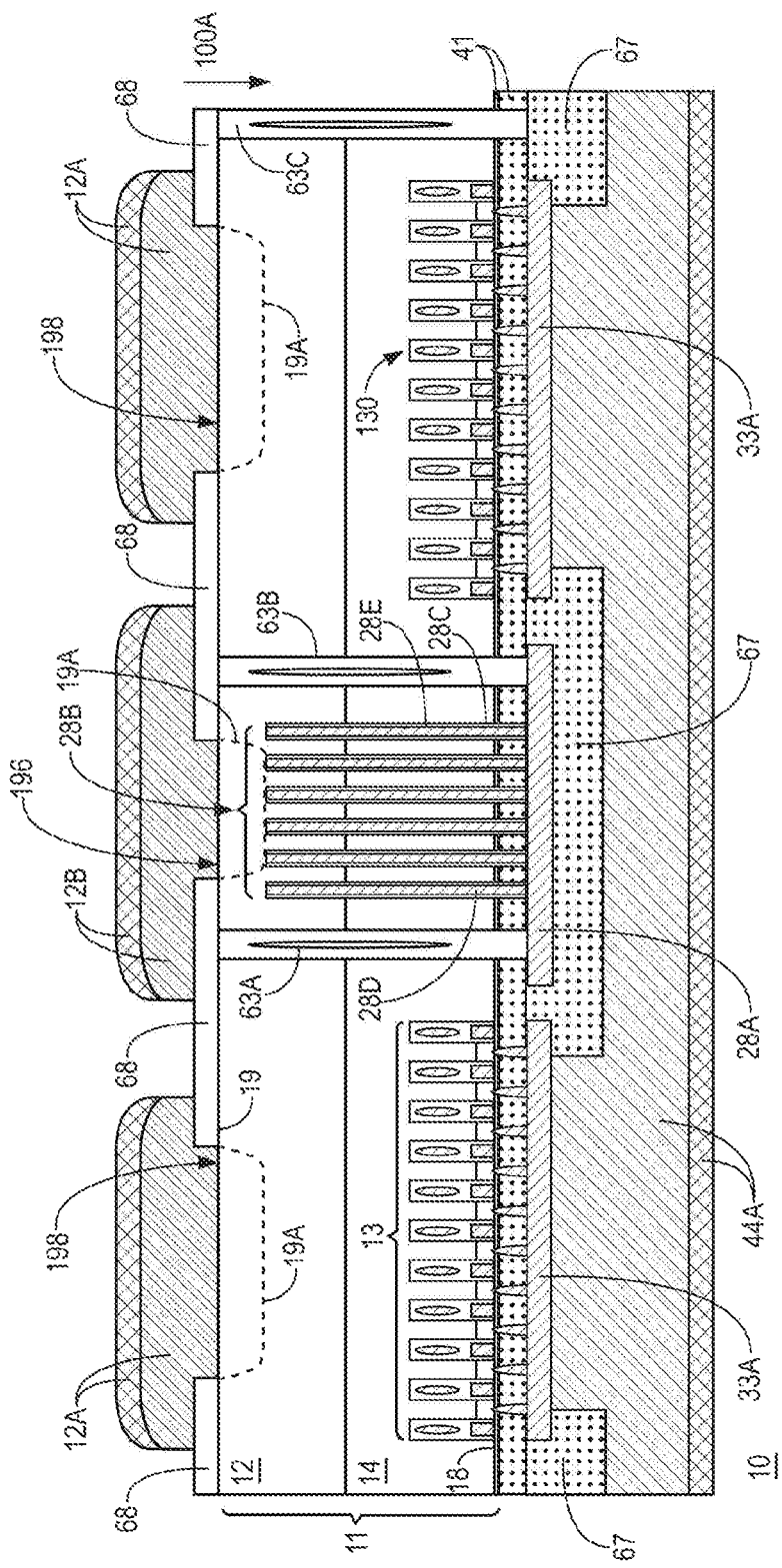
FIG. 1 illustrates a cross-sectional view of a semiconductor device in accordance with the present description.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

For simplicity and clarity of the illustration, elements in the figures are not necessarily drawn to scale, and the same reference numbers in different figures denote the same elements. Additionally, descriptions and details of well-known steps and elements are omitted for simplicity of the description.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

Although the semiconductor devices are explained herein as certain N-type conductivity regions and certain P-type conductivity regions, a person of ordinary skill in the art understands that the conductivity types can be reversed and are also possible in accordance with the present description, taking into account any necessary polarity reversal of voltages, inversion of transistor type and/or current direction, etc.

In addition, the terminology used herein is for the purpose of describing particular examples only and is not intended to be limiting of the disclosure. As used herein, the singular forms are intended to include the plural forms as well, unless the context clearly indicates otherwise.

As used herein, "current-carrying electrode" means an element of a device that carries current through the device, such as a source or a drain of an MOS transistor, an emitter or a collector of a bipolar transistor, or a cathode or anode of a diode, and a "control electrode" means an element of the device that controls current through the device, such as a gate of a MOS transistor or a base of a bipolar transistor.

The term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

The terms "comprises", "comprising", "includes", and/or "including", when used in this description, are open ended terms that specify the presence of stated features, numbers, steps, operations, elements, and/or components, but do not preclude the presence or addition of one or more other features, numbers, steps, operations, elements, components, and/or groups thereof.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

Although the terms "first", "second", etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

It will be appreciated by one skilled in the art that words, "during", "while", and "when" as used herein related to circuit operation are not exact terms that mean an action takes place instantly upon an initiating action but that there may be some small but reasonable delay, such as propagation delay, between the reaction that is initiated by the initial action. Additionally, the term "while" means a certain action occurs at least within some portion of a duration of the initiating action.

The use of word "about", "approximately", or "substantially" means a value of an element is expected to be close to a state value or position. However, as is well known in the art there are always minor variances preventing values or positions from being exactly stated.

Unless specified otherwise, as used herein, the word "over" or "on" includes orientations, placements, or relations where the specified elements can be in direct or indirect physical contact.

Unless specified otherwise, as used herein, the word "overlapping" includes orientations, placements, or relations where the specified elements can at least partly or wholly coincide or align in the same or different planes.

It is further understood that the examples illustrated and described hereinafter suitably may have examples and/or may be practiced in the absence of any element that is not specifically disclosed herein.

DETAILED DESCRIPTION OF THE DRAWINGS

Typical vertical FET semiconductor devices are configured with source and gate electrodes at the top side of the device and with a drain electrode at the reverse or lower side of the device. Certain applications, such as die stacking, can require a vertical device with both the drain and gate electrodes at the upward oriented side and the source at the lower oriented side, wherein the orientation is referenced in accordance with packaging requirements. Therefore, a low cost method that uses standard FET manufacturing and FET design to achieve this is needed. Previous source-down devices have several issues including, for example, limited scalability due to processing requirements within in trench structures; unique device structures and architectures that require long drawn-out process development activities; and difficulty in matching the electrical performance of source-up devices.

In general, the present description and examples relate to semiconductor device structures and methods of making semiconductor structures for drain/gate up with source-down configurations using as few as two (2) extra masking steps compared to a standard source-up semiconductor devices. The structure and method can use a typical source-up fabrication flow with modifications to provide the structures as described herein to enable the source-down configuration. The active device structures can comprise trench gate devices with or without shield electrodes. The structures can be power semiconductor devices, such as metal-oxide-semiconductor field effect transistor (MOSFET) structures, insulated gate bipolar transistor (IGBT) structures, MOS-gated thyristors, or other power semiconductor devices. In addition, the structure and method are relevant to other electronic devices having electrodes are on opposing surfaces of a work piece and electrical communication between the opposing surfaces would be beneficial.

In some examples, a first gate conductor on one side of a semiconductor wafer or region of semiconductor material is electrically connected to a second gate conductor on the second side using one or more conductive structures extending at least partially through the semiconductor wafer, such as through-semiconductor or through-silicon via structures. The through-semiconductor vias can have various shapes. The through-semiconductor vias can be filled with one or more conductive materials, including doped polysilicon, metals, resistive materials, capacitive materials, other materials described hereinafter, or other materials as known to one of ordinary skill in the art including combinations of such materials.

In some examples, the through-semiconductor vias extend through one or more regions of the semiconductor wafer, such as one or more epitaxial regions into the underlying substrate. In other examples, the through-semiconductor vias can be used in combination with or replaced by a heavily doped part of the epitaxial region(s). In some examples, the reverse side of the semiconductor wafer can be recessed to connect to the through-semiconductor vias. In other examples, the reverse side can be heavily doped at least proximate to the through-semiconductor vias to improve ohmic contact. In other examples, the through-semiconductor vias can be lined with a dielectric material, such as an oxide, a nitride, or an oxy-nitride. In some examples, the through-semiconductor vias can extend all the way through the semiconductor wafer. The through-semiconductor via structures can be isolated using an isolation structure, such as isolation trenches placed around the through-semiconductor via structures. In addition, the isolation structure can be placed in scribe grid locations to provide improve reliability. The isolation trenches can have variable widths and designs depending on device requirements. The isolation trenches can be partially filled with at least one dielectric layer such as an oxide, a nitride, or an oxy-nitride. The isolation trenches can also be partially filled with dielectric and partially filled with other material such as polysilicon.

Some of the through-semiconductor via structures and/or the isolation trenches can be used as electrical devices, such as capacitor structures by adding an extra dielectric and a second conductive plate into the through-semiconductor via structures.

In some examples, the source electrode can be one or more a blanket conductive layers that are electrically isolated from the first gate conductor by one or more dielectric layers or structures. The source electrode can comprise mostly copper, in some cases with a capping layer to protect the copper from oxidation and/or to provide a layer compatible with soldering.

In some examples, the semiconductor wafer is thinned from the reverse side to expose the isolation trenches. In some examples, the isolation trenches can be used as stop structures or end point detection structures for the thinning process. During the thinning process, the semiconductor wafer can be attached to a carrier substrate, such as a carrier tape or wafer carrier. For the thinning process, grinding, lapping, or etching can be used.

In some examples, the thinning step can expose the through-semiconductor vias that extend from the first gate conductor on the opposite side of the semiconductor wafer.

In other examples, an additional etch or other removal step is used to expose the through-semiconductor vias. In further examples, the through-semiconductor vias terminate within the semiconductor wafer, which can have high dopant concentration to provide a low resistance and ohmic contact between the through-semiconductor vias and the conductive layer used to provide a reverse side gate contact. In other examples, recesses can be etched from the reverse side to expose the through-semiconductor vias.

In some examples, after the removal step a dielectric can be deposited over the reverse side of the semiconductor wafer. The isolation or through-semiconductor vias can be used for backside alignment marks, eliminating the need for front to back alignment capability. Openings can be provided in the dielectric above the through-semiconductor vias and other portions of the second side. In some cases, the patterned dielectric can be used as a mask to etch the exposed semiconductor material, and in some cases, expose the through-semiconductor vias. Another opening provides a drain region while the opening above the through-semiconductor vias provides the gate region.

In some examples, a plasma etching step is used to etch through the semiconductor wafer from the reverse side towards the top side where the active device structures are located to expose a dielectric structure and/or the source electrode proximate to the top side. During the plasma etching step, the semiconductor wafer can be attached to a carrier substrate, such as a carrier tape.

Another singulation process, such as sawing or laser processing can be used to cut through the source electrode on the top side while the semiconductor wafer is attached to a carrier substrate. The carrier substrate can be the same as the carrier substrate used for the plasma etching step.

More particularly, in an example a method of forming a semiconductor device includes providing a semiconductor wafer having a first side and a second side opposite to the first side and semiconductor devices, wherein each semiconductor device comprises a gate pad and active device structures including source regions and gate electrodes adjacent to the first side, and a drain region and a gate region at the second side, and wherein the gate pad is electrically connected to the gate electrodes. The method includes providing a conductive structure extending from the gate pad at least partially through the semiconductor wafer towards the second side to electrically connect the gate pad to the gate region at the second side. The method includes providing a first electrode over the first side electrically coupled to the source regions and electrically isolated from the gate pad. The method includes providing a second electrode at the second side adjacent to the gate region and electrically connected to the conductive structure. The method includes providing a third electrode electrically connected to the drain region at the second side. In some examples, the conductive structure comprises a through-semiconductor via.

In an example, a semiconductor device includes a region of semiconductor material having a first side and a second side opposite to the first side. Active device structures are adjacent to the first side, the active device structures include first current carrying regions. A first control electrode is at the first side electrically connected to the active device structures, a second current carrying region is at the second side, and a second control electrode is at the second side. A conductive structure is in the region of semiconductor material and electrically connects the first control electrode to the second control electrode. A first current carrying electrode is at the first side electrically and is connected to the first current carrying regions, and a second current carrying electrode is at the second side electrically connected to the second current carrying region. The conductive structure is electrically isolated from the first current carrying region and the second current carrying region.

In an example, a semiconductor device includes a region of semiconductor material having a first side and a second side opposite to the first side. Active device structures are adjacent to the first side, the active device structures comprising source regions and gate electrodes. A first gate conductor is at the first side and is electrically connected to the gate electrodes, a drain region is at the second side, a second gate conductor is at the second side, and through-semiconductor vias extend from the first side towards the second side and electrically connecting the first gate electrode to the second gate electrode. A source electrode is at the first side electrically connected to the source regions, and a drain electrode is at the second side electrically connected to the drain region. The through-semiconductor vias are electrically isolated from the source regions and the drain region. The structure provides a gate/drain up with a source-down configuration.

Other examples are included in the present disclosure. Such examples may found in the figures, in the claims, or in the description of the present disclosure.

Figure 2:
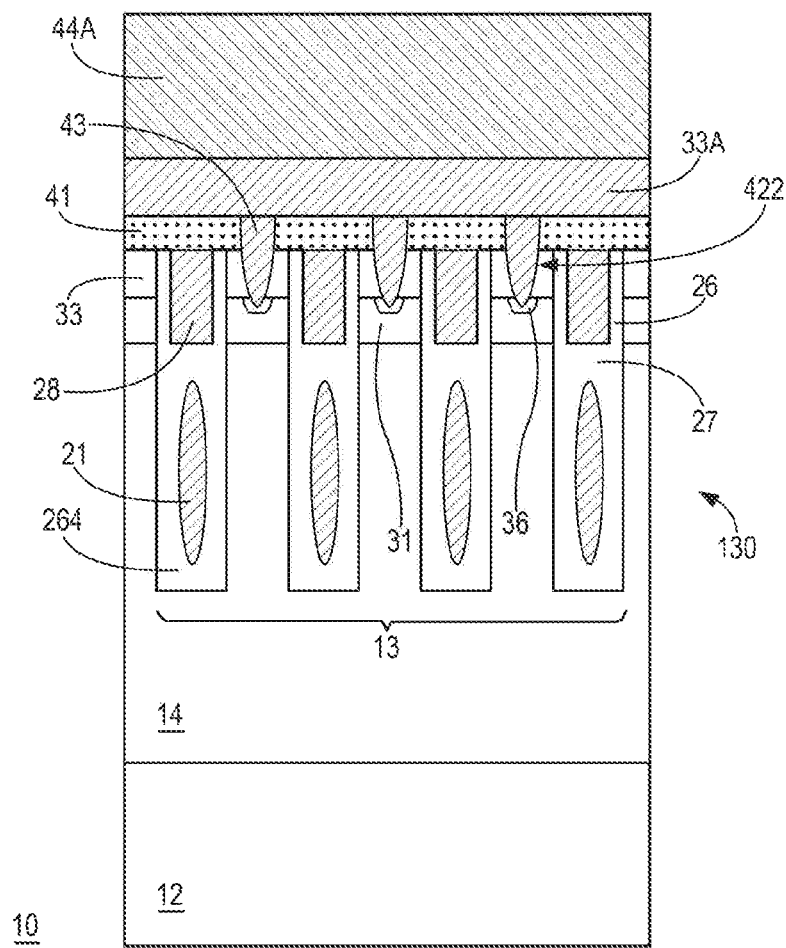
FIG. 2 illustrates a partial cross-sectional view of a portion of the semiconductor device of FIG. 1 in accordance with the present description.

FIG. 1 illustrates a cross-sectional view of an electronic device 10, a semiconductor device 10, or semiconductor structure 10 having a source-down configuration in accordance with the present description. In the present example, electronic device 10 is illustrated as a MOSFET device, but it is understood that other types of devices can be used including, but not limited to insulated gate bipolar transistor (IGBT) devices, MOS-gated thyristors, sensor devices, and other types of electronic devices. FIG. 2 illustrates an enlarged partial cross-sectional view of a portion of semiconductor device 10 including trench gate structures 13.

In some examples, semiconductor device 10 comprises a work piece, such as a region of semiconductor material 11 having a major surface 18, which is a first side, and an opposing major surface 19, which is a second side. Region of semiconductor material 11 can include a bulk semiconductor substrate 12, such as an N-type conductivity silicon substrate having a resistivity in a range from about 0.001 ohm-cm to about 0.005 ohm-cm. By way of example, substrate 12 can be doped with phosphorous, arsenic, or antimony.

In some examples, region of semiconductor material 11 further includes a semiconductor layer 14, doped region 14, doped layer 14, or doped layers 14, which can be formed in, on, or overlying substrate 12. In one example, semiconductor layer 14 can be an N-type conductivity region or layer when substrate 12 is N-type conductivity, and can be formed using epitaxial growth techniques, ion implantation and diffusion techniques, or other techniques as known to one of ordinary skill in the art. In one example, semiconductor layer 14 includes major surface 18 of region of semiconductor material 11. It is understood that region of semiconductor material 11, semiconductor substrate 12, and/or semiconductor layer 14 can include other types of materials including, but not limited to, heterojunction semiconductor materials, and semiconductor substrate 12 and semiconductor layer 14 can each include different materials. Such materials can include SiGe, SiGeC, SiC, GaN, AlGaN, and other similar materials as known to one of ordinary skill in the art.

In some examples, semiconductor layer 14 has a dopant concentration that is less than the dopant concentration of substrate 12. The dopant concentration and thickness of semiconductor layer 14 can be increased or decreased depending, for example, on the desired breakdown ($BV_{DSS}$) rating and layout design of semiconductor device 10. In some examples, semiconductor layer 14 can have a dopant profile that changes over its depth inward from major surface 18. Such changes can include linear and non-linear profiles over the thickness of semiconductor layer 14 perpendicular to major surface 18.

As illustrated in FIG. 2, trench gate structures 13 extend inward from major surface 18 into region of semiconductor material 11. In some examples, trench gate structures 13 each comprise a shield electrode 21 in a lower portion of each trench, a shield dielectric layer 264 separating shield electrode 21 from semiconductor layer 14, gate dielectric layer 26 over upper surfaces of each trench, a control electrode 28, such as a gate electrode 28 disposed adjacent to gate dielectric 26, and a dielectric fill structure 27 electrically isolating shield electrode 21 from gate electrode 28. In some examples, shield electrodes 21 and gate electrodes 28 comprise doped polycrystalline semiconductor material, such as doped polysilicon. In some examples, the polysilicon is doped with an N-type conductivity dopant, such as phosphorous or arsenic. In other examples, the polysilicon can be doped with a P-type conductivity dopant, such as boron.

In some examples, semiconductor device 10 further comprises a body region 31, which in the present example comprises a P-type conductivity doped region, and is disposed adjacent to trench gate structures 13 as generally illustrated in FIG. 2. Body region 31 can be a plurality of individual doped regions, or can be a continuous interconnected doped region. Body regions 31 have a dopant concentration suitable for forming inversion layers that operate as conduction channels or channel regions for semiconductor device 10 when an appropriate bias voltage is applied to gate electrodes 28. Body regions 31 can extend from major surface 18 to a depth, for example, from about 0.7 microns to about 1.0 microns. Body regions 31 can be formed using doping techniques, such as ion implantation and anneal techniques. Body regions 31 can also be referred to base regions or PHV regions.

In some examples, first current carrying regions 33, such as source regions 33 can be formed within, in, or overlying body regions 31 and can extend from major surface 18 to a depth for example, from about 0.2 microns to about 0.4 microns. In some examples, source regions 33 can be N-type conductivity doped regions and can be formed using, for example, a phosphorous or arsenic dopant source. Source regions 33 can also be referred to current conducting regions or current carrying regions. Source regions 33 can be formed using ion implantation and anneal techniques.

In some examples, an ILD structure 41 can be formed overlying major surface 18. In one embodiment, ILD structure 41 comprises one or more dielectric or insulative materials or layers. In some examples, ILD structure 41 can comprise oxide, nitride, oxy-nitride, or combinations thereof, may include dopants such as an N-type dopant, a P-type dopant, combinations of both, or fluorine. ILD structure 41 can be planarized to provide a more uniform surface topography, which improves manufacturability.

In some examples, conductive regions 43 can be formed within contact openings 422 or contact vias 422 and configured to provide electrical contact to source regions 33 and body regions 31 through contact regions 36. In some examples, conductive regions 43 can be conductive plugs or plug structures. In some examples, conductive regions 43 can include a conductive barrier structure or liner and a conductive fill material. In some examples, the barrier structure can include a metal/metal-nitride configuration, such as titanium/titanium-nitride or other related or equivalent materials as known by one of ordinary skill in the art. In other examples, the barrier structure can further include a metal-silicide structure. In some examples, the conductive fill material includes tungsten. In some examples, conductive regions 43 can be planarized to provide a more uniform surface topography. In some examples, a source pad 33A is over ILD structure 41 and is electrically connected to source regions 33 through conductive regions 43. In the present example, trench gate structures 13 (including, e.g., shield electrodes 21, shield dielectric 264, dielectric fill structure 27, gate electrodes 28, and gate dielectric 26), body regions 31, source regions 33, and contact regions 36 can be referred to active device structures 130 provided adjacent to major surface 18 of semiconductor device 10. So as to not complicate the drawings, the individual elements of active device structures 130 may not be labeled in other drawings described later.

In accordance with the present description and referring back to FIG. 1, semiconductor device 10 further includes a first control electrode 28A, first gate control electrode 28A, or gate pad 28A over major surface 18. Gate pad 28A is electrically connected to each of gate electrodes 28 in trench gate structures 13, and electrically coupled to a gate region 196 at second major surface 10 by a conductive structure 28B. In some examples, conductive structure 28B comprises through-semiconductor vias 28B, such as through-silicon vias (TSVs) 28B, which extend inward into region of semiconductor material 11 from gate pad 28A towards gate region 196. Through-semiconductor vias 28B comprise trenches 28C or a recess 23C, which can be etched into region of semiconductor 11 using photo-masking and etch techniques.

Through-semiconductor vias 28B can be filled with one or more fill materials 28D. Fill material 28D can include a single material or a plurality of materials that can be in the form of layer, a plurality of layers, a single film, or a plurality of films. Fill material 28D can be conductive, resistive, an insulator, or a combination therefore (for example, when forming capacitors within the trenches). In some examples, fill material 28D can be a conductive material and include doped amorphous silicon, doped polycrystalline silicon, a metal (an elemental metal, as opposed to a molecular compound), an alloy, a metal nitride, a metal-semiconductor compound, a metal-semiconductor-nitrogen compound, or other materials as known to one of ordinary skill in the art. The composition of the conductive material may depend on when the conductive material is formed. Fill material 28D may include an adhesion film, a barrier film, and a conductive-fill film. In a particular embodiment, the adhesion film includes a refractory metal, the barrier layer includes a refractory metal nitride, and the conductive-fill film includes a refractory metal different from the adhesion film. In another particular example, the fill material includes doped polysilicon. In some examples, fill material 28D comprises titanium/titanium nitride/tungsten.

In some examples, through-semiconductor vias 28B extend all of the way through region of semiconductor material 11 to directly contact gate electrode 12B, which is over major surface 19. In some examples, through-semiconductor vias 28B can be lined with an optional dielectric material 28E, such as an oxide, nitride, oxy-nitride, other materials as known by one of ordinary skill in the art, or combinations thereof. It is understood that opposing ends of fill material 28D are devoid of dielectric material 28E to allow electrical communication between gate pad 28A and gate electrode 12B. In some examples, source pads 33A and gate pad 28A comprise a barrier material, such as titanium/titanium nitride, and another conductive material, such as an aluminum copper alloy.

In some examples, semiconductor device 10 further comprises isolation structure 63 provided to electrically isolate through-semiconductor vias 28B from other regions of semiconductor device 10 (e.g., from source regions 33 and drain region 198). In some examples, isolation structure 63 electrically isolates gate region 196 from drain regions 198 at major surface 19. In some examples, isolation structure 63 can include isolation portions 63A and 63B on opposing sides of through-semiconductor vias 28B in a cross-sectional view. In some examples, isolation portions 63A and 63B are part of the same continuous isolation structure, which can continuously (i.e., without breaks in the structure) surround through-semiconductor vias 28B. In some examples, an isolation portion 63C can placed in scribe grid regions 100A of semiconductor device 10 to provide additional isolation for the active region of semiconductor device 10. Isolation portion 63C is an example of an edge isolation structure disposed at an outer edge of region of semiconductor material 11.

In some examples, isolation portions 63A, 63B, and 63C can be dielectric-filled trench structures. In some examples, oxides, nitrides, or oxy-nitrides can be used. In other examples, the trenches can be filled with other materials, such as un-doped polysilicon in combination with a dielectric. In some examples, isolation portions 63A, 63B, and 63C can comprise voids. In some examples, isolation portions 63A, 63B and 63C can extend entirely through region of semiconductor material 11 from the first side to the second side as generally illustrated in FIG. 1. Other types of isolation structures can be used instead of or in combination with isolation structure 63. In some examples, one or more of through-semiconductor vias 28B or isolation structure 63 can be configured as a capacitor structure by filling the respective trench with a pair of conductive plates separated by a dielectric.

In some examples, a dielectric 67 is over gate pad 28A and source pads 33A. Openings are provided in dielectric 67 to expose portions of source pads 33A. Dielectric 67 is configured to isolate gate pad 28A from source pads 33A. Dielectric 67 can include or more layers of dielectrics, such as oxides, doped oxides, nitrides, oxy-nitrides, organic materials, other insulating materials as known to one of ordinary skill in the art including combinations of such materials. A conductor 44A is provided over dielectric 67 and within the openings to provide electrical connection to source pads 33A. In the present example, conductor 44A provides a source electrode for semiconductor device 10, and can comprise a conductive material, such as copper, a copper alloy, or other conductive materials as known to one of ordinary skill in the art. In some examples, conductor 44A further comprises a capping layer to protect the copper from oxidation or to provide solder compatibility. In some examples, the capping layer comprises tin/silver.

Semiconductor device 10 further comprises current carrying electrode 12A, which in the present vertical MOSFET example can be a drain electrode, and a control electrode 12B, which in the present example is a gate electrode. In some examples, gate pad 28A can be referred to as a first gate conductor, and gate electrode 12B can be referred to as a second gate conductor. Electrodes 12A and 12B are provided over major surface 19 of semiconductor device 10, which is the reverse side of semiconductor device 10. Electrodes 12A and 12B can comprise one or metals or other conductive materials. In some examples, electrodes 12A and 12B can comprise a barrier material and copper-nickel-gold or other wire bondable and/or solderable materials. In some examples, a dielectric 68 is first provided over major surface 19 and then patterned to provide contact openings for electrodes 12A and 12B. In some examples, dielectric 68 comprises an oxide, a nitride, or an organic insulating material. In some examples, portions of region of semiconductor material 11 can be recessed (represented by dashed lines 19A) before electrodes 12A and 12B are formed. In some examples, recess 19A below electrode 12B can expose portions of one or more through-semiconductor vias 28B so that electrode 12B makes direct contact to fill material 28D.

Figure 3:
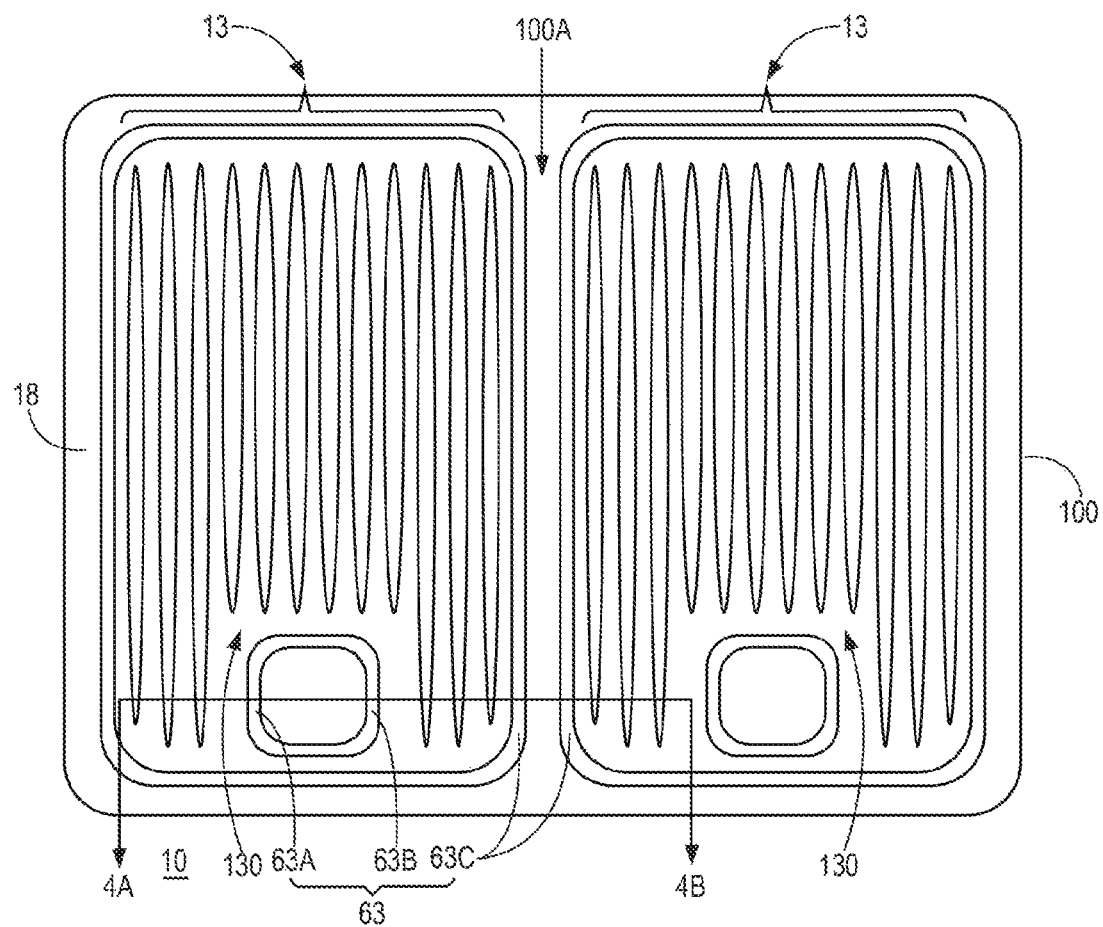
FIG. 3 illustrates a top plan view of the semiconductor device FIG. 1 at a stage of fabrication as a part of a semiconductor wafer in accordance with the present description.
Figure 4:
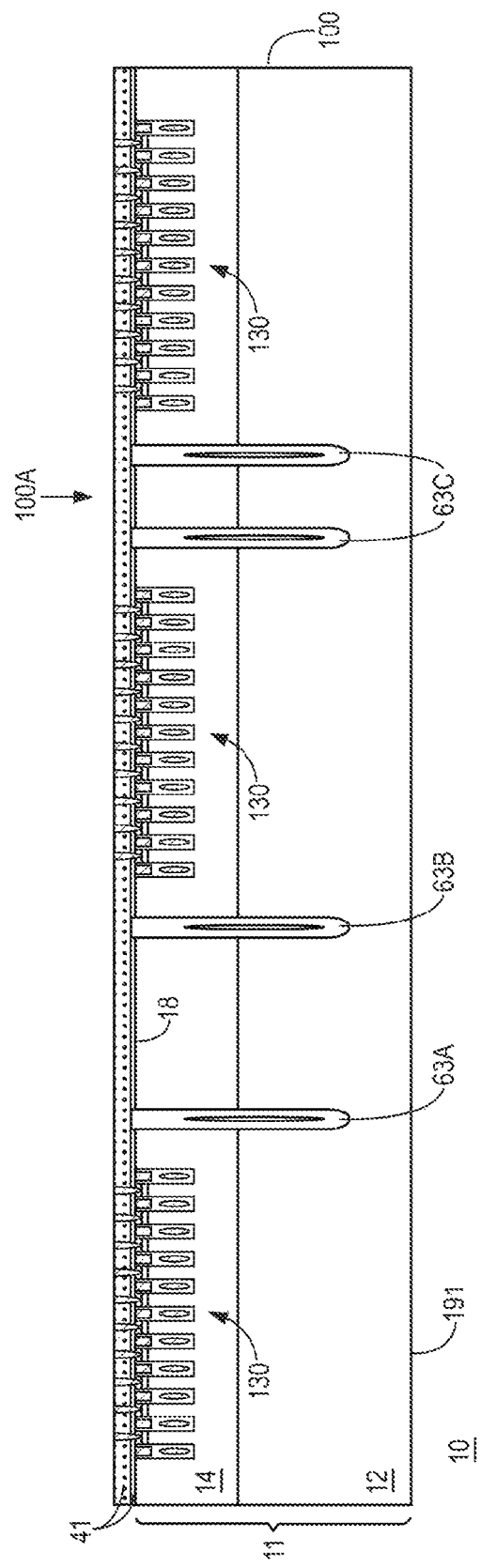
FIG. 4 illustrates a cross-sectional view of the semiconductor device taken along reference line 4A-4B of FIG. 3 in accordance with the present description.

FIG. 3 illustrates a top plan view of semiconductor device 10 at a stage of fabrication as part of semiconductor wafer 100 in accordance with the present description. FIG. 4 illustrates a cross-sectional view of semiconductor device 10 taken along reference line 4A-4B of FIG. 3.

At this stage of fabrication, active device structures 130 have been provided adjacent to major surface 18 of region of semiconductor material 11, which is part of semiconductor wafer 100. In accordance with the present description, the fabrication flow up to this stage beneficially follows a typical source-up flow, which helps reduce manufacturing costs. That is, by utilizing a portion of a pre-existing process, manufacturing costs can be reduced. In some examples, a patterning step, such as a first patterning step, is used to provide openings in a mask for forming isolation structure 63 in semiconductor wafer 100. The openings in the mask expose portions of region of semiconductor material 11 at major surface 18. Next, a trench etch can be used to form deep trenches for isolation structure 63. By way of example, the trenches for isolation structure 63 can be etched using plasma etching techniques with a fluorocarbon chemistry or a fluorinated chemistry (for example, $SF_6/O_2$) or other chemistries or removal techniques as known to one of ordinary skill in the art.

In some examples, the trenches for isolation structure 63 extend into region of semiconductor material 11 to a depth from major surface 18 that can reached using removal processes that remove part of major surface 191 and reduce the thickness of semiconductor wafer 100 to a desired thickness. In some examples, the trenches for isolation structure 63 extend to within about 25 microns to about 75 microns of major surface 191. After the trenches for isolation structure 63 are etched, a dielectric fill material is provided within the trenches, and can include an oxide, a nitride, an oxy-nitride, other materials as known to one of ordinary skill in the art, or combinations thereof. The dielectric fill material can be planarized using a chemical mechanical planarization (CMP) process or etch back process. Depending on the voltage rating of semiconductor device 10, the width or the number of trenches can be increased, for example, with increasing voltage.

FIG. 4 illustrates optional isolation portions 63C, which are placed in scribe grid region 100A of semiconductor wafer 100. Isolation portions 63C can provide additional electrical isolation and/or protection from contamination at the edges of semiconductor device 10. Isolation portions 63A and 63B define a periphery or perimeter for gate pad 28A and through-semiconductor vias 28B, which can be disposed inside that perimeter. After isolation structure 63 is formed, ILD structure 41 can be provided over major surface 18. In some examples, ILD structure 41 comprises oxides, which can be doped or undoped, nitrides, oxy-nitrides, or combinations thereof, and can be formed using chemical vapor deposition (CVD), low pressure CVD (LPCVD), plasma-enhanced CVD (PECVD), or other deposition processes as known to one of ordinary skill in the art. ILD structure 41 can be planarized, using, for example, CMP techniques. In other examples, ILD structure 41 is provided before isolation structure 63 and can be used as a hard mask to assist in forming isolation structure 63.

Figure 5:
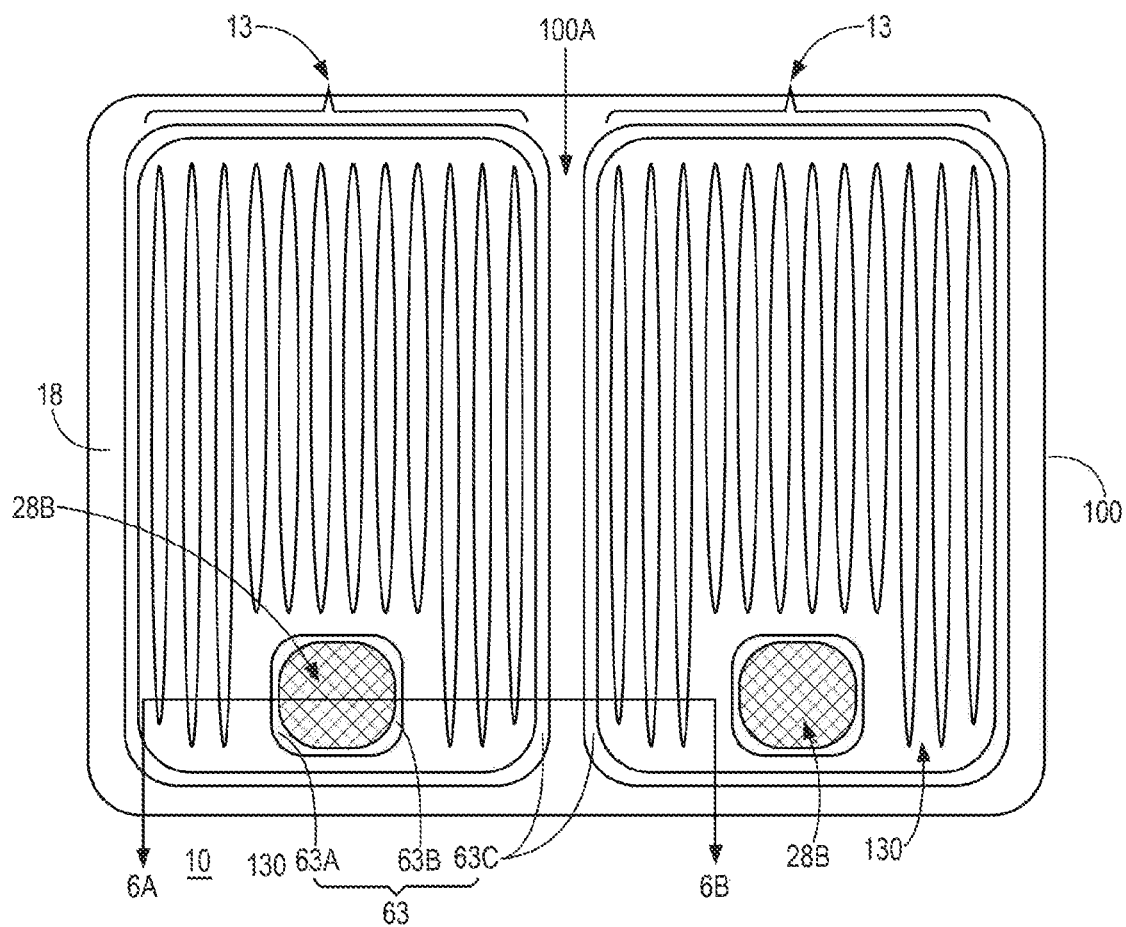
FIG. 5 illustrates a top plan view of the semiconductor device of FIG. 1 at a stage of fabrication in accordance with the present description.
Figure 6:
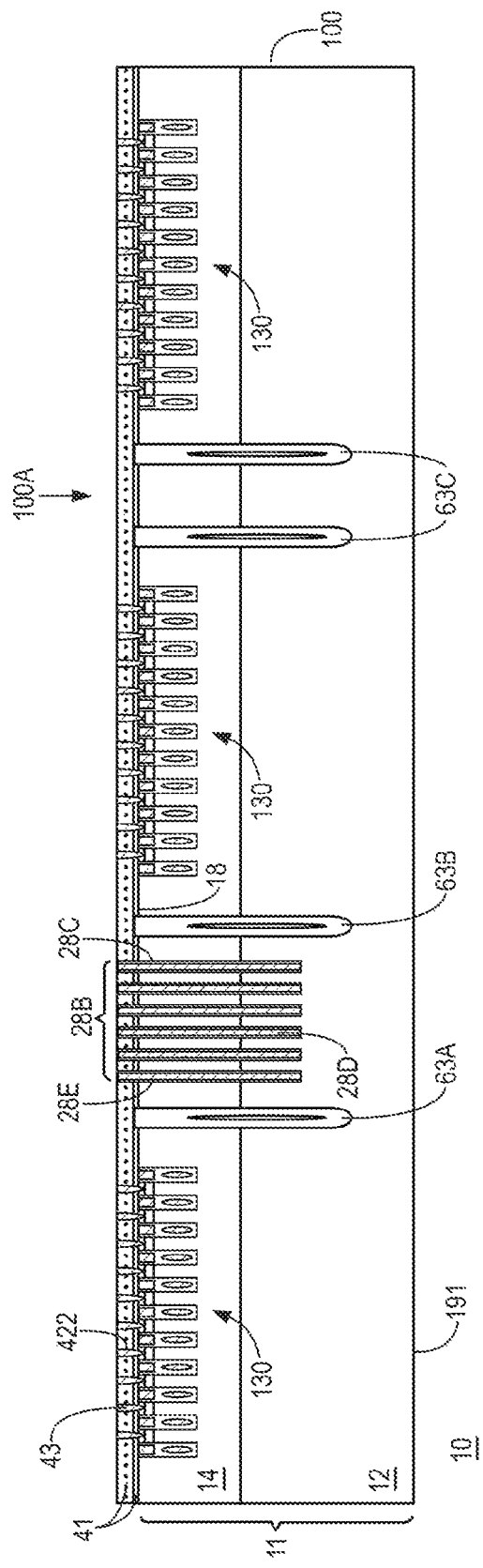
FIG. 6 illustrates a cross-sectional view of the semiconductor device taken along reference line 6A-6B of FIG. 5 in accordance with the present description.

FIG. 5 illustrates a top plan view of semiconductor device 10 after further processing in accordance with the present description. FIG. 6 illustrates a cross-sectional view of semiconductor device 10 taken along reference line 6A-6B of FIG. 5. In some examples, a patterning step, such as a second patterning step, is used to provide openings in ILD structure 41 for forming through-semiconductor vias 28B extending into region of semiconductor material 11 from major surface 18 of region of semiconductor material 11. Photo-masking and etch techniques can be used to provide the openings in ILD 41 for trenches 28C of through-semiconductor vias 28B. The shape and quantity of trenches 28C for through-semiconductor vias 28B can vary, and can include, for example, multiple trenches 28C or a single trench or recess 28C.

Trenches 28C for through-semiconductor vias 28B can be formed using plasma etching techniques with a fluorocarbon chemistry or a fluorinated chemistry (for example, $SF_6/O_2$) or other chemistries or removal techniques as known to one of ordinary skill in the art. The depth of trenches 28C for through-semiconductor vias 28B can be the same depth as the trenches used for isolation structure 63, or the depth can be shallower than the depths of the trenches used for isolation structure 63 (which is generally illustrated in FIG. 6). In some examples, optional dielectric material 28E can be used to line sidewall surfaces of trenches 28C. In some examples, dielectric material 28E comprises oxide, nitride, oxy-nitride, or other materials as known to one of ordinary skill in the art, or combinations thereof. The part of dielectric material 28E, which is along the bottom surfaces of trenches 28C, is removed to expose region of semiconductor material 11 at the bottom surfaces of trenches 28C. In some examples, removal of dielectric material 28E at the bottom surface can occur before fill material 28D is provided, or it can be removed in a later removal if, for example, the bottom surfaces of dielectric material 28E are exposed at major surface 19.

Next, fill material 28D is provided within trenches 28C (and over dielectric 28E if it is used) and can be planarized using, for example, CMP techniques. Fill material 28D can comprise the materials as described previously. Fill material 28D can be formed using CVD, PECVD, atom layer deposition (ALD), sputtering, evaporation, or other processing techniques as known to one of ordinary skill in the art. In other examples, a pair of through-semiconductor vias 28B can be configured as a trench capacitor with the pair configured as opposing conductive plates separated by a dielectric. In some examples, the dielectric can comprise an oxide, a low-k dielectric, a high-k dielectric, or other materials as known to one of ordinary skill in the art. When fill material 28D comprises a semiconductor material, the semiconductor material can be doped either in-situ or ex-situ or both.

In some examples, after through-semiconductor vias 28B are formed, contact vias 422 can be formed in ILD structure 41 and conductive regions 43 can be provided for electrical contacts to source regions 33 and contact regions 36 as illustrated in FIG. 2.

Figure 7:
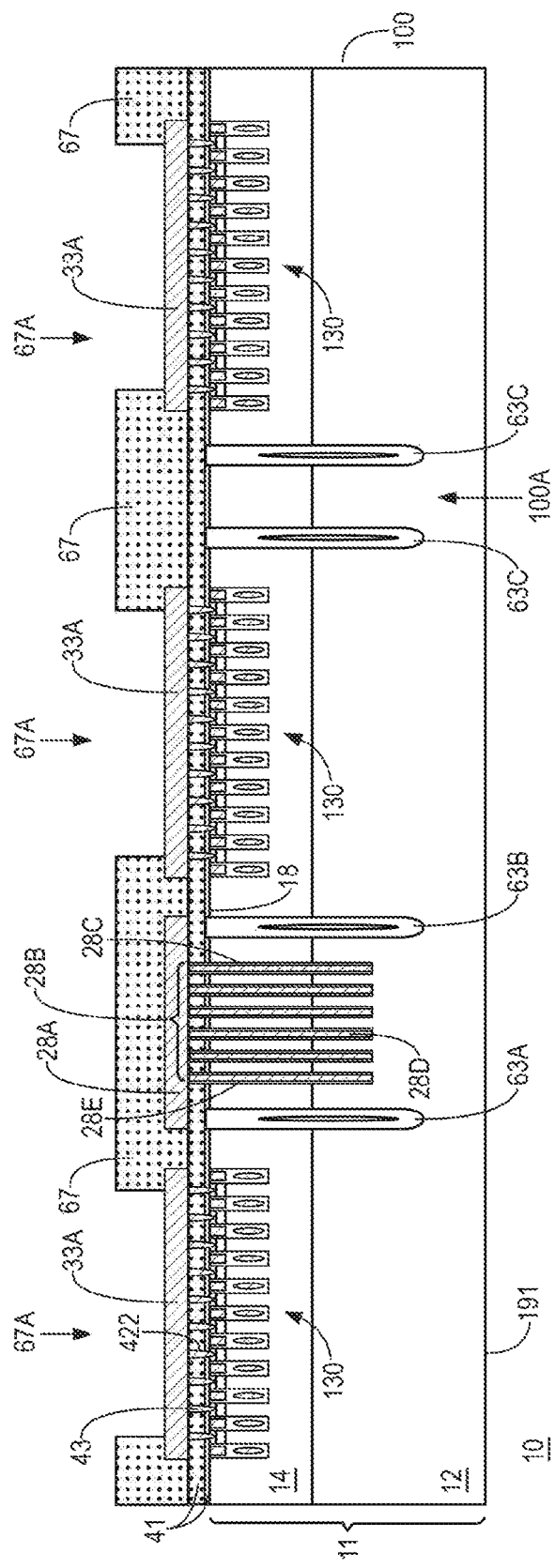
FIG. 7 illustrates a cross-sectional view of the semiconductor device at a stage of fabrication in accordance with the present description.

FIG. 7 illustrates a cross-sectional view of semiconductor device 10 after additional processing. In some examples, conductive material is deposited over major surface 18. In some examples, the conductive material comprises one or more metal materials, polycrystalline semiconductor material, silicide materials, other materials as known to one of ordinary skill in the art, or combinations thereof. In some examples, the conductive layer comprises titanium/titanium-nitride/aluminum-copper and has a thickness in range from about 5,000 Angstroms through about 10,000 Angstroms. The conductive layer can be formed using evaporation, sputtering, CVD, or other deposition processes as known to one of ordinary skill the art.

After the conductive layer is formed, a patterning step is used to pattern the conductive layer to provide source pads 33A and gate pad 28A (also referred to as a first gate conductor). Photo-masking and etching techniques can be used to provide source pads 33A and gate pad 28A. Source pads 33A are electrically connected to conductive regions 43, and gate pad 28A is electrically connected to gate electrodes 28 and through-semiconductor vias 28B. In some examples, dielectric 67 is then provided over gate pad 28A and source pads 33A, which electrically isolates gate pad 28A from source pads 33A. Dielectric 67 can include or more layers of dielectrics, such as oxides, doped oxides, nitrides, oxy-nitrides, organic materials, other insulating materials as known to one of ordinary skill in the art including combinations of such materials. Dielectric 67 can be formed using CVD, LPCVD, PECVD, ALD, spin-on, or other deposition processes as known to one of ordinary skill in the art. Next, openings 67A are provided in dielectric 67 to expose parts of source pads 33A. Photo-masking and etching techniques can be used to provide openings 67A.

Figure 8:
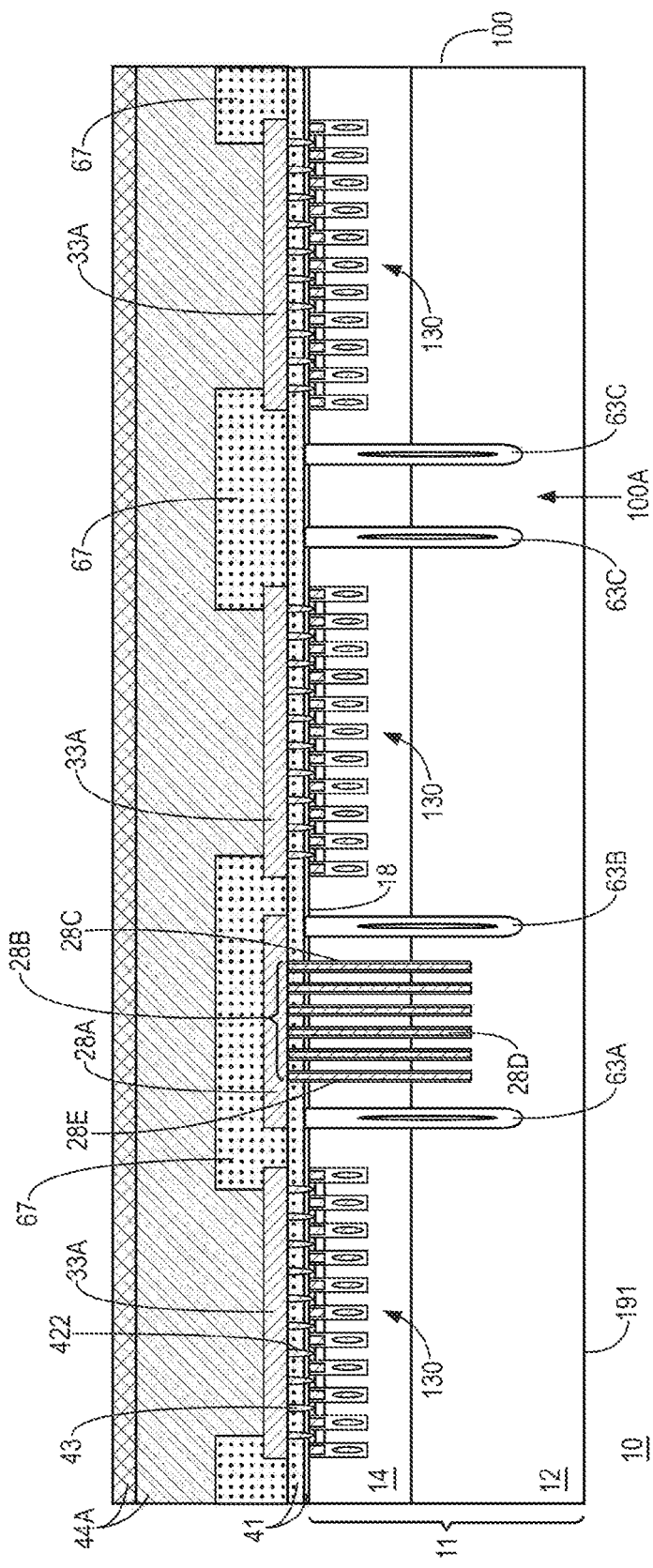
FIG. 8 illustrates a cross-sectional view of the semiconductor device at a stage of fabrication in accordance with the present description.

FIG. 8 illustrates a cross-sectional view of semiconductor device 10 and further processing. In some examples, conductor 44A is provided over dielectric 67 and within openings 67A to provide electrical connection to source pads 33A. Conductor 44A is an example of a source electrode. In some examples, conductor 44A comprises copper, a copper alloy, or other conductive materials as known to one of ordinary skill in the art. In some examples, conductor 44A further comprises a capping layer to protect the copper from oxidation or to provide solder compatibility. In some examples, the capping layer comprises tin/silver. Conductor 44A can be formed using evaporation, sputtering, CVD, plating, or other depositions processes as known to one of ordinary skill in the art. In some examples, conductor 44A can have a thickness in a range from about 10,000 Angstroms to about 20,000 Angstroms. It is understood that conductor 44A can comprise other structures, such as prefabricated interconnect structures that attached to source pads 33A using, for example, conductive adhesives or solders.

Figure 9:
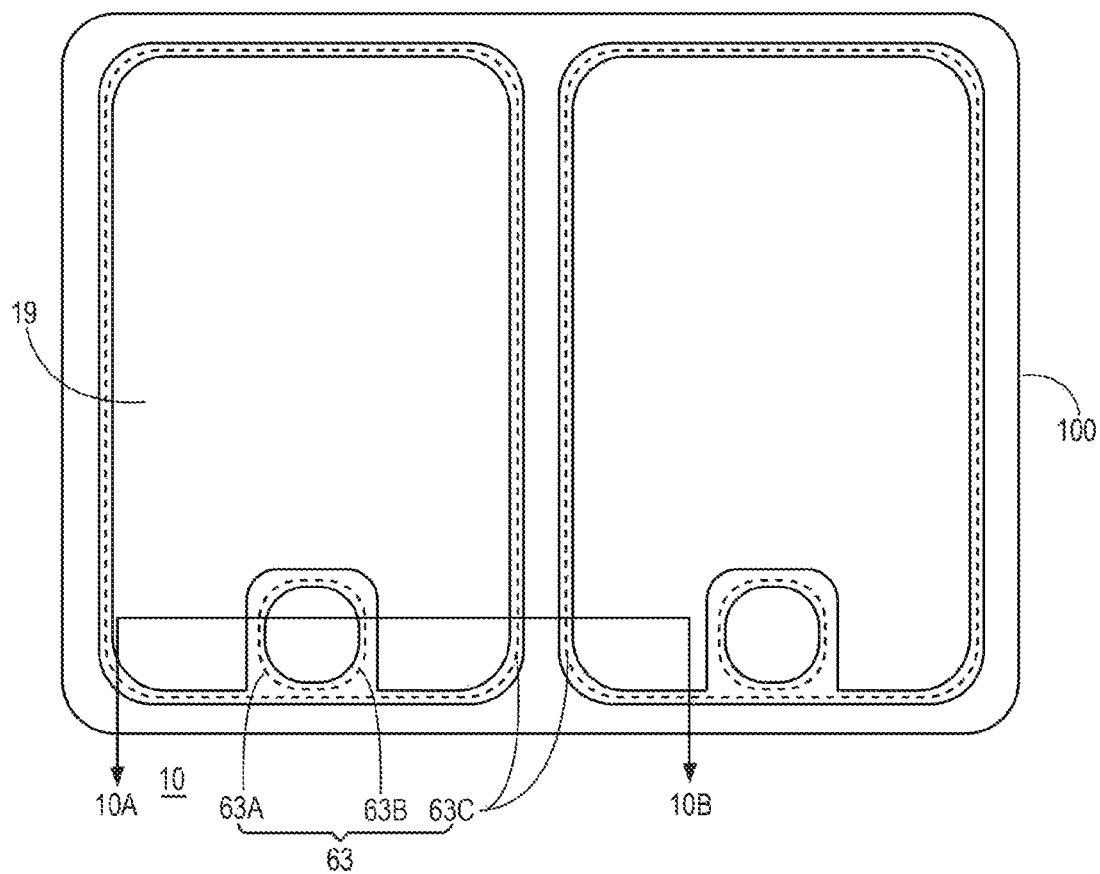
FIG. 9 illustrates a bottom plan view of the semiconductor device of FIG. 1 a stage of fabrication in accordance with the present description.
Figure 10:
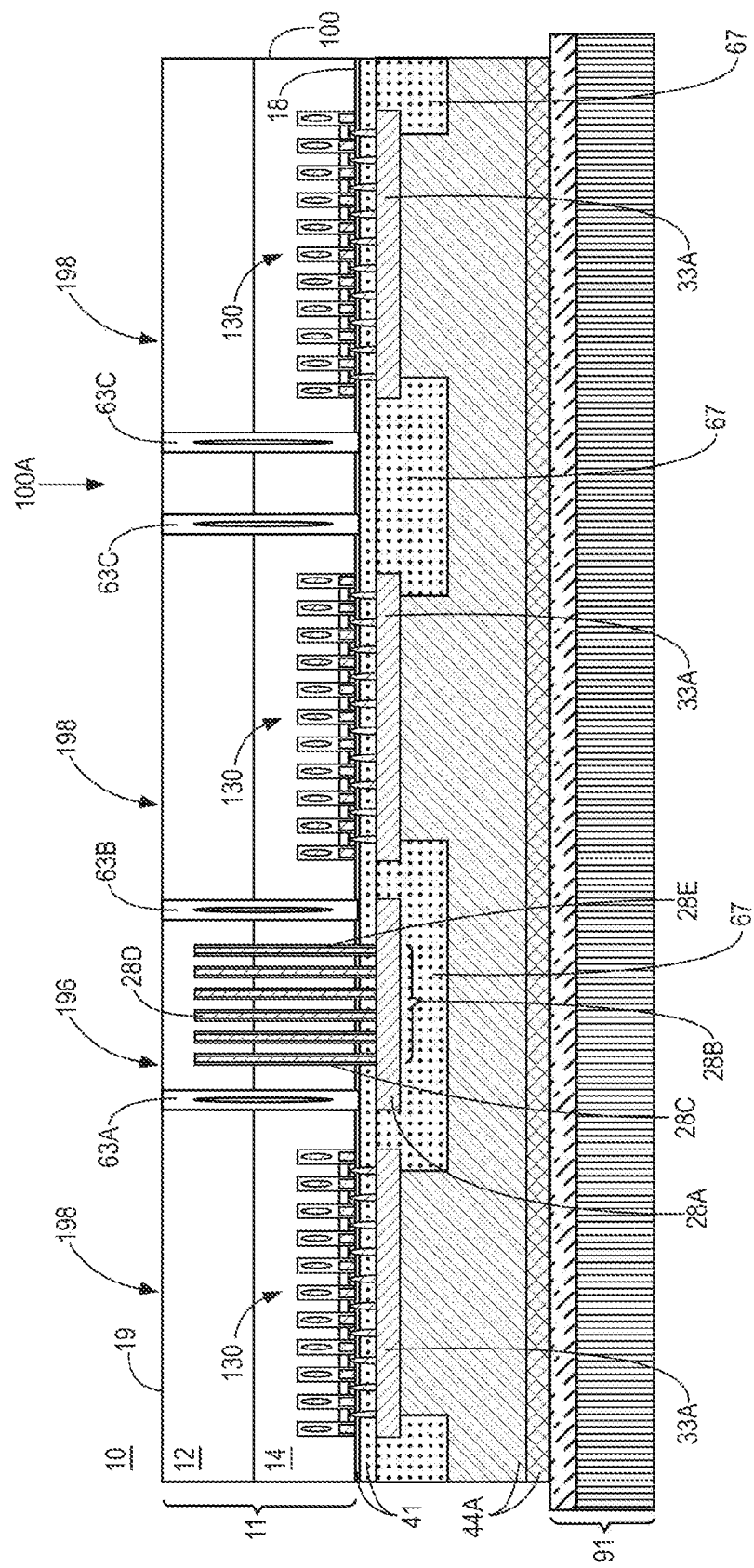
FIG. 10 illustrates a cross-sectional view of the semiconductor device taken along reference line 10A-10B of FIG. 9.

FIG. 9 illustrates a bottom plan view of semiconductor device 10 after further processing, and FIG. 10 illustrates a cross-sectional view of semiconductor device 10 taken along reference line 10A-10B of FIG. 9. In some examples, semiconductor wafer 100 is attached to a carrier 91, such as carrier tape or a carrier substrate. Carrier 91 is configured to support semiconductor wafer 100 during, for example, a wafer thinning process. In the present example, semiconductor wafer 100 is placed with active device structures 130 proximate to carrier 91 so that major surface 18 is interposed between carrier 91 and major surface 191/19. In some examples, one or more removal processes are used to remove portions of the semiconductor wafer 100 from major surface 191 (illustrated in FIG. 8). In some examples, a grinding or lapping process can be used followed by an etching process to remove any damage from the grinding or lapping process. This provides major surface 19 and, in some examples, exposes isolation structure 63 from major surface 19 as generally illustrated in FIG. 10. One feature of isolation structure 63 is that it can be used for endpoint detection during the removal processes, which provides improved thickness control for semiconductor wafer 100. Stated differently, isolation structure 63 can be used as a stop structure for the removal process. In some examples, this step defines gate region 196 and drain regions 198 at major surface 19 of regions of semiconductor material 11.

Figure 11:
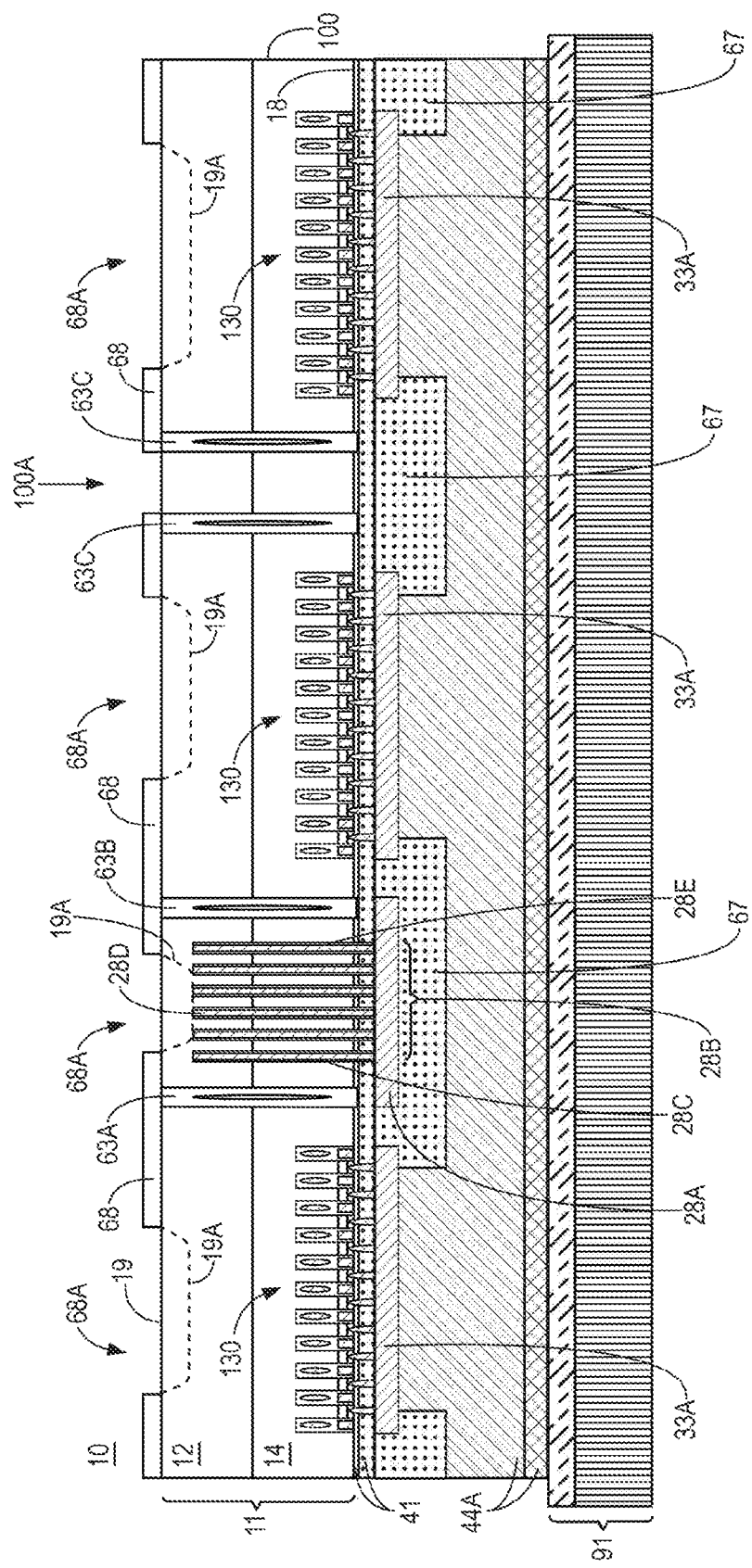
FIGS. 11, 12, 13, 14, and 15 illustrate cross-sectional sectional views of the semiconductor device at various further stages of fabrication in accordance with the present description.

FIG. 11 illustrates a cross-sectional view of semiconductor device 10 after additional processing. In examples, dielectric 68 is provided over major surface 19, and then patterned to provide openings 68A, which expose portions of major surface 19. In some examples, dielectric 68 comprises an oxide deposited using LPCVD, PECVD, or other low temperature depositions techniques as known to one of ordinary skill in the art. In some examples, dielectric 68 can be formed using a spin-on process or a laminate process. In other examples, dielectric 68 can be provided using a printing process, such as a 3D printing process. In other examples, dielectric 68 comprises an organic material, such as polyimide.

Dielectric 68 functions to isolate electrodes 12A and 12B formed later. Photo-masking and etch techniques can be used to provide openings 68A. When photo-masking and etching techniques are used to form openings 68A, isolation structure exposed from major surface 19 beneficially provides an alignment structure for photo-masking alignment equipment to effectively align for openings 68A in desired locations.

In some examples, dielectric 68 laterally overlaps isolation structure 63 along major surface 19 as generally illustrated in FIG. 11. In some examples, a recess etch or other removal process can be used to provide recesses 19A extending inward from major surface 19 within openings 68A. Recesses 19A can be formed using an etching process with dielectric 68 acting as a hard mask. In some examples, a fluorine based chemistry can be used to form recesses 19A extending inward from major surface 19. In some examples, the recess 19A aligned with through-semiconductor vias 28B can extend to depth sufficient to expose ends of through-semiconductor vias 28B proximate to major surface 19. If dielectric material 28E at the tips of trenches 28C needs to be removed, that removal can occur after recess 19A is formed. In other examples, dopants can be added to region of semiconductor material 11 through openings 68A to increase the dopant concentration for more ohmic contacts. In some examples, ion implantation and laser anneal techniques can be used to provide the additional dopants.

Figure 12:
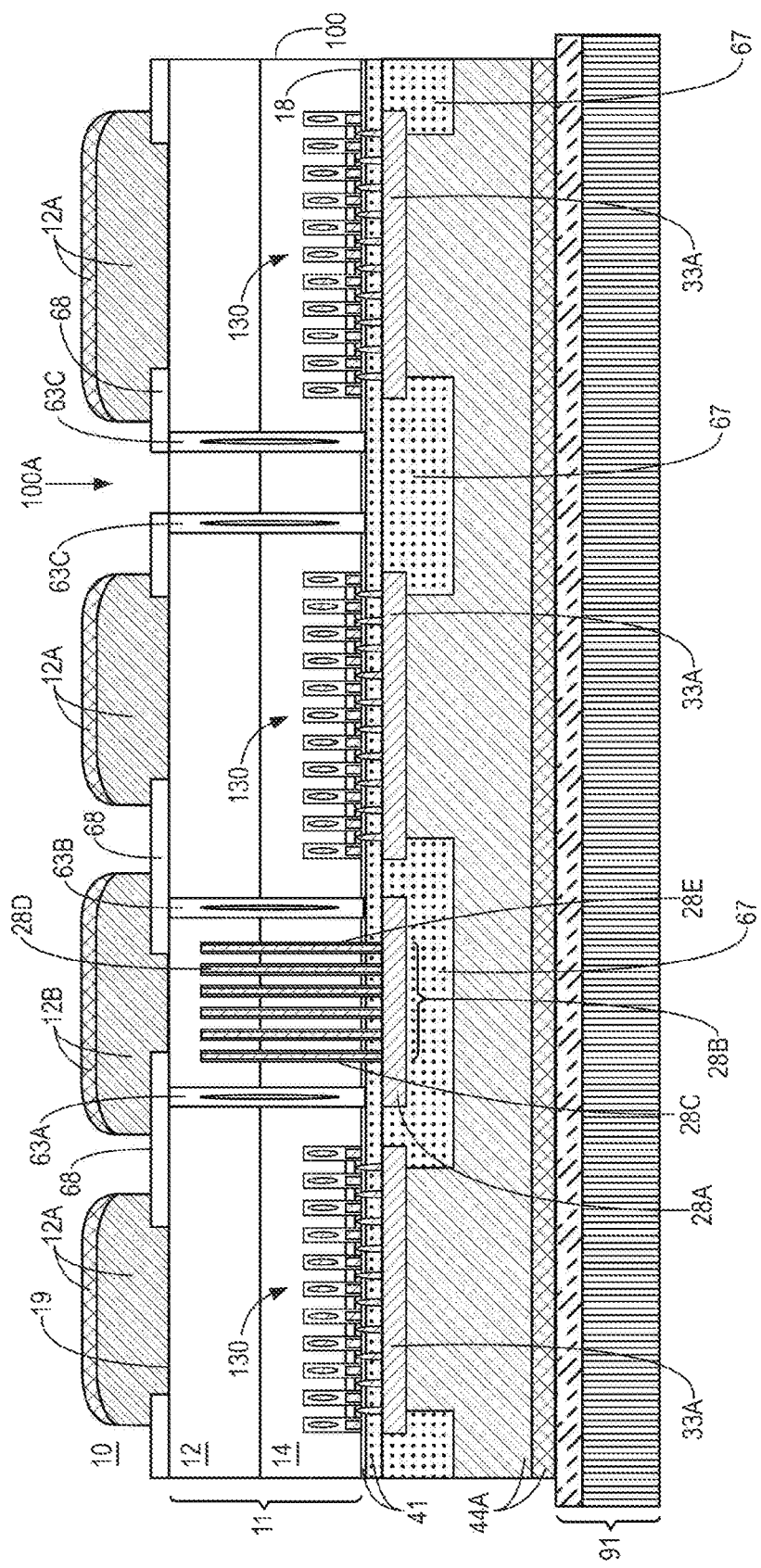

FIG. 12 illustrates a cross-sectional view of semiconductor device 10 after further processing. In some examples, a conductor is provided over major surface 19 and dielectric 68 and within openings 68A, and then patterned to provide electrodes 12A and 12B. The conductor can comprise one or metals or other conductive materials. In some examples, the conductor comprises a barrier material and copper-nickel-gold or other wire bondable solderable materials. In some examples, evaporation, sputtering, plating, or processes can be used to provide the conductor, and photo-masking and etching can be used to provide electrodes 12A and 12B. In other examples, electrodes 12A and 12B can be provided first and dielectric 68 provided after electrodes 12A and 12B to provide electrical isolation between electrodes 12A and 12B. In the present vertical MOSFET example, electrodes 12A are configured as drain electrodes and electrode 12B is configured as a gate electrode.

Figure 13:
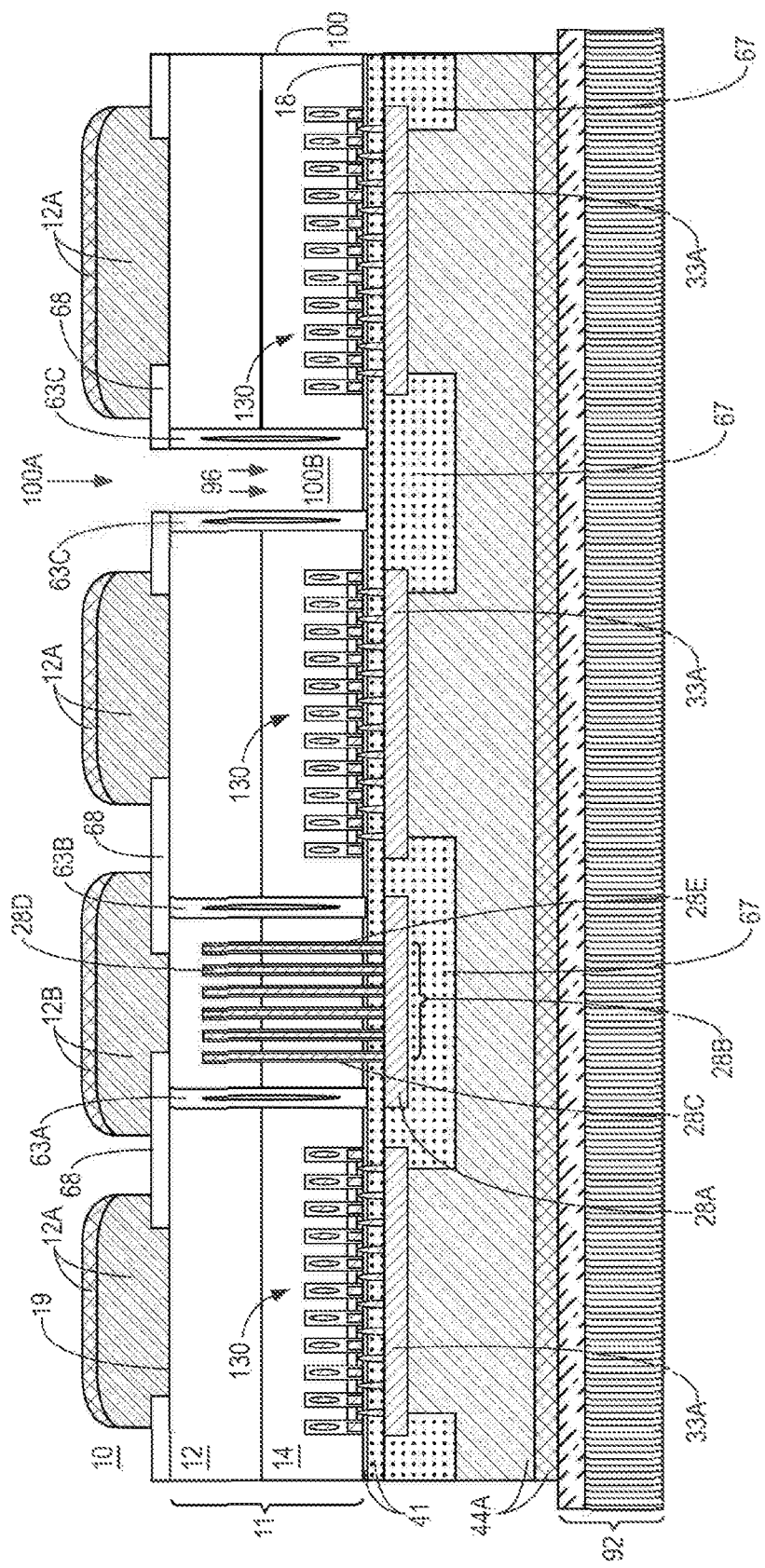

FIG. 13 illustrates a cross-sectional view of semiconductor device 10 after further processing. In some examples, carrier 91 is removed and another carrier 92 is attached to semiconductor wafer 100 proximate to major surface 18. In some examples, carrier 92 comprises a material that is selective to a plasma dicing processing. In some examples, carrier 92 comprises a carrier tape. In other examples, carrier 91 remains in place for the subsequent processing. In some examples, a plasma etching step is used to remove part of regions of semiconductor material 11 from major surface 19 in the opening between isolation portions 63C corresponding to scribe grid region 100A. More particularly, part of region of semiconductor material 11 is removed from scribe grid region 100A using a plasma etching process.

In some examples, semiconductor wafer 100 can be etched through the opening between isolation portions 63C to form or define singulation line or opening 100B extending from major surface 19 to major surface 18 of region of semiconductor material 11. The etching process can be performed using a chemistry (generally represented as arrows 96) that selectively etches the semiconductor material (for example, silicon) of regions of semiconductor material at a much higher rate than that of dielectrics and/or metals. In some examples, semiconductor wafer 100 can be etched using a process commonly referred to as the Bosch etching process. In some examples, semiconductor wafer 100 can be etched using the Bosch etching process in a deep reactive ion etch system. In some examples, the width of singulation line 100B can be from about forty (40) microns to about sixty (60) microns. Such a width is sufficient to ensure that the openings that form singulation line 100B can be formed completely through region of semiconductor material 11 and to accommodate the width of a laser singulation device or a dicing or saw blade used in a subsequent singulation step in accordance with the present description.

Singulation line 100B stops proximate to or on ILD structure 41 because of the etch selectivity as generally illustrated in FIG. 13. In some examples, ILD structure 41 and/or dielectric 67 can be used as a stop layer for the plasma etch singulation process. In some examples, singulation line 100B can be formed in about five to about thirty minutes using the Bosch etching process. At this step, singulation line 100B can be bounded on three (3) sides by dielectric material. In other examples, isolation portions 63C are not used.

Figure 14:
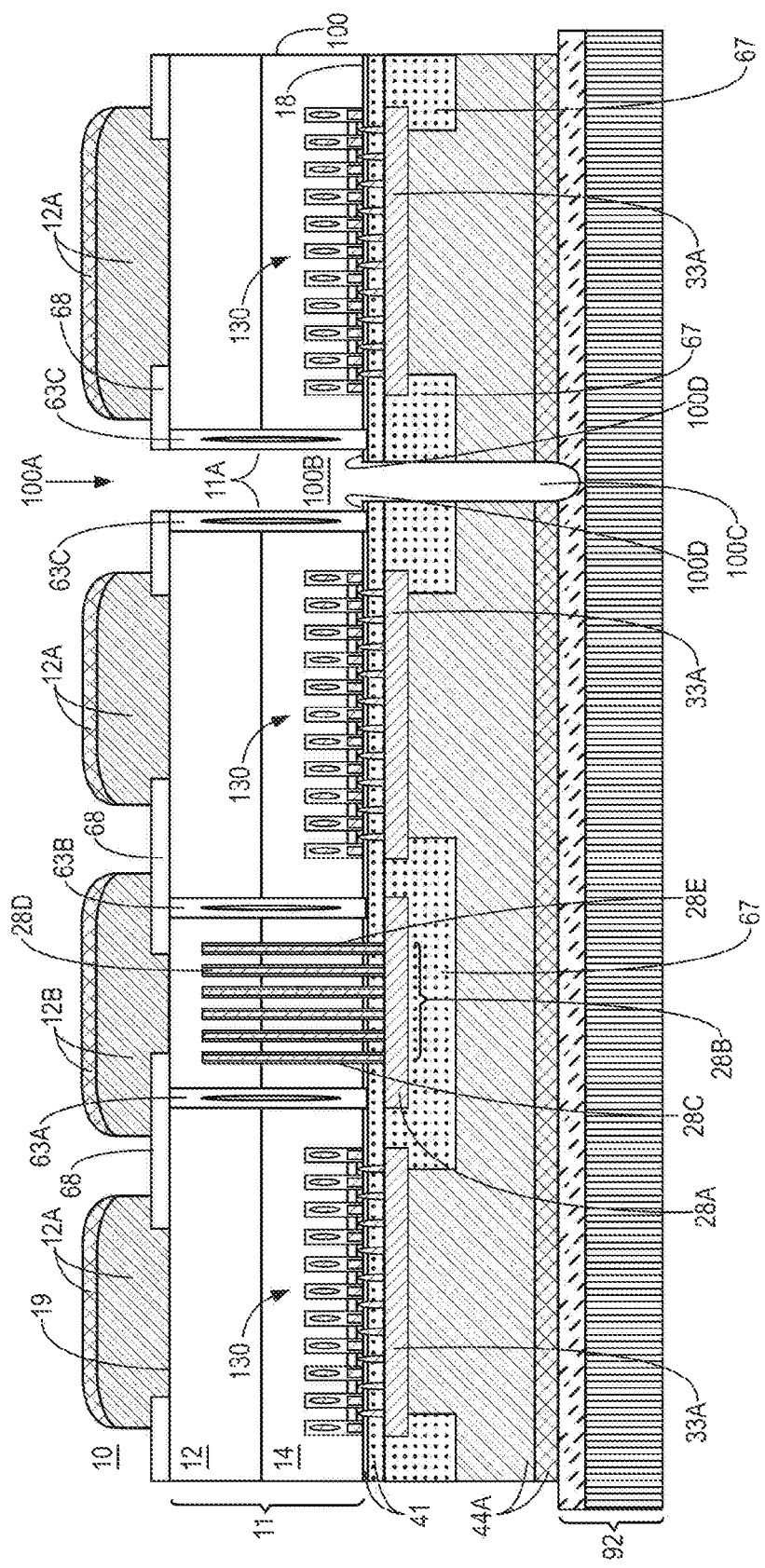

FIG. 14 illustrates a cross-sectional view of semiconductor device 10 after further processing. In some examples, a singulation process is used to form singulation line 100C through conductor 44A. In some examples, a laser singulation process can be used. In other examples, a dicing or sawing process can be used with dicing blade having a width narrower than singulation line 100B to provide singulation line 100C. In some examples, a protective layer is first provided over electrodes 12A and 12B, but in some examples leaving singulation line 100B exposed for the laser or dicing process. In some examples, a water-soluble protective layer can be used, such as HogoMax® brand of protective materials available from Disco Corporation of Tokyo, Japan. In some examples, singulation line 100C has a width between about 15 microns and about 30 microns. More particularly, in some examples, singulation line 100C is narrower than singulation line 100B to provide shoulder regions 100D, which can provide a protective structure to prevent solder from subsequent sub-assembly connects to electrodes 12A and 12B from shorting to source pad 28A along outer edges 11A of semiconductor device 10. Shoulder regions 100D can also be referred to as step regions or solder dam regions. Stated differently, with the multiple-step singulation process of the present description, conductor 44A extends to overlap outer edges 11A of region of semiconductor material 11 and provide shoulder regions 100D as defined by singulation lines 100B and 100C.

Figure 15:
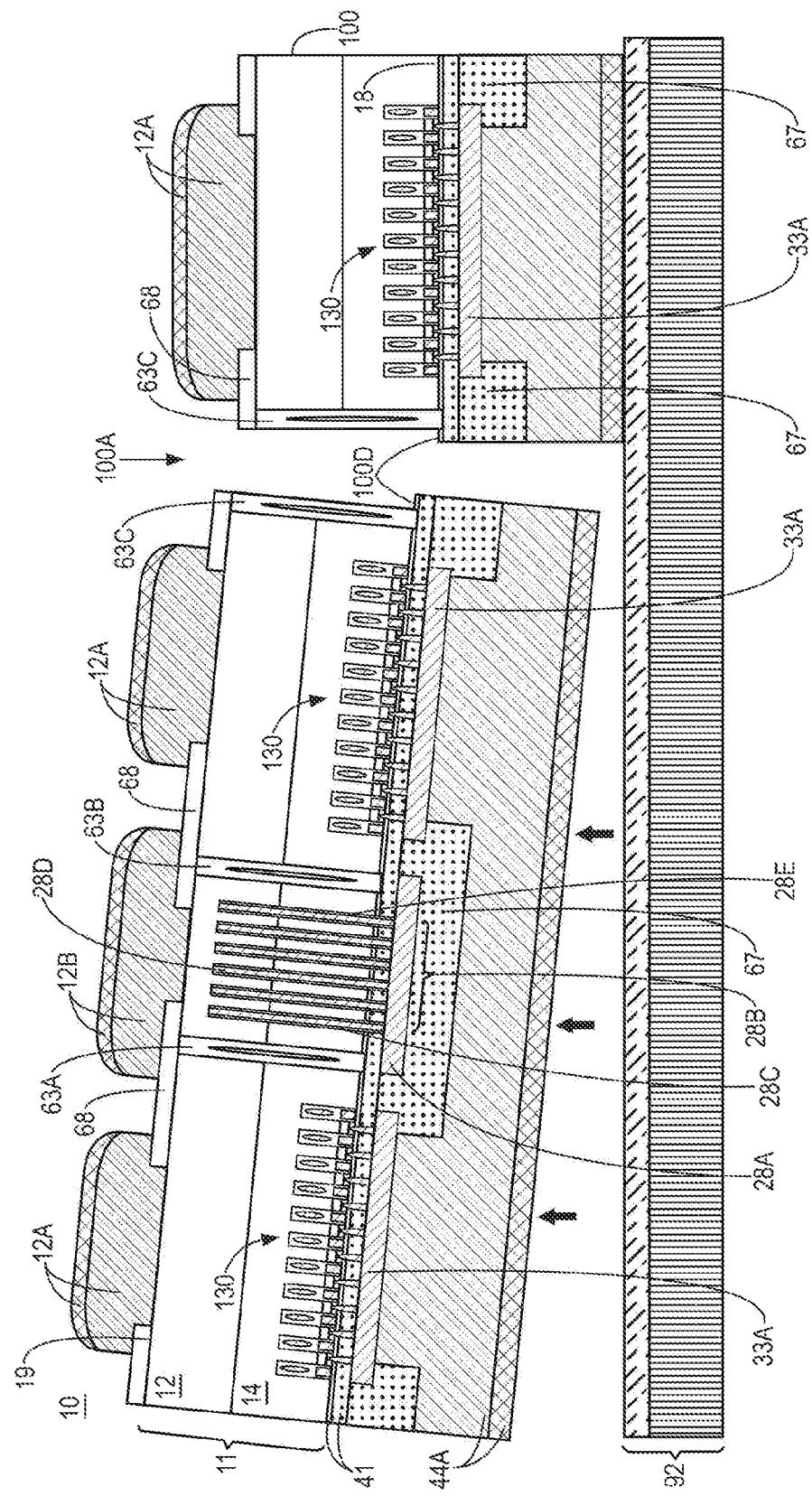

In some examples, the post-plasma etch singulation process can comprise using a reverse cut dicing process to minimize any potential for burring defects. In some examples, singulation line 100C extends substantially completely through conductor 44A, which means a small amount of material may remain. Such a small amount can be separated when semiconductor device 10 is removed from carrier 92 as illustrated in FIG. 15. In other examples, singulation line 100C extends completely through conductor 44A and partially into carrier 92 as illustrated in FIG. 14.

Figure 16:
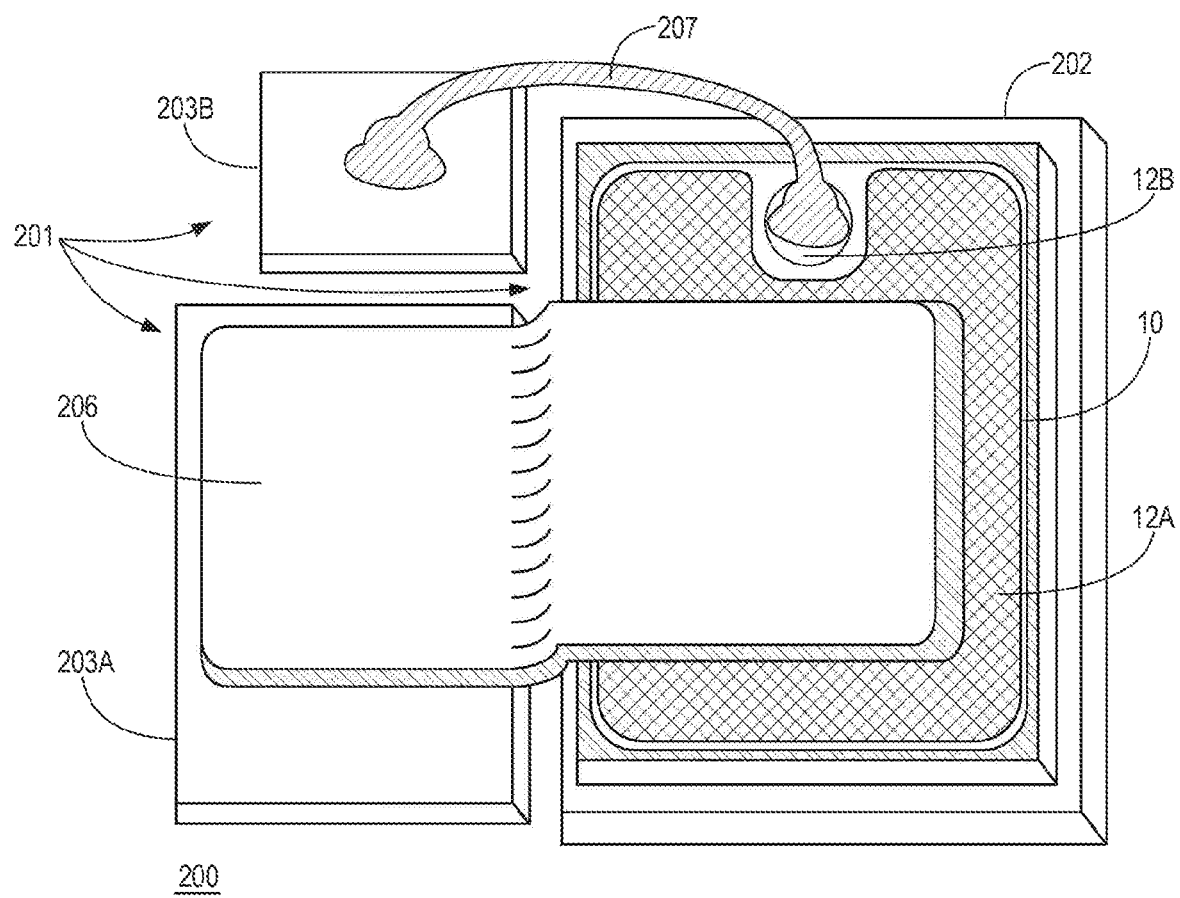
FIG. 16 is a top perspective view of the semiconductor device incorporated into an example sub-assembly in accordance with the present description.

In some examples, a pick-and-place apparatus can be used to remove individual semiconductor devices 10 form carrier 92 as illustrated in FIG. 15 and placed into a next level of assembly. FIG. 16 illustrates a top perspective view of semiconductor device 10 as part of an example sub-assembly 200 in accordance with the present description. In some examples, sub-assembly 200 comprises a package substrate 201, such as lead frame 201. In some examples, lead frame 201 comprises a conductive material, such as a copper alloy, which may also be plated with another conductive material. In some examples, lead frame 201 includes a die pad 202 and leads 203A and 203B.

In accordance with the present description, conductor 44A of semiconductor device 10 (which in this configuration is the source electrode) is attached to die pad 202 using an attachment material, such as a conductive organic material or a solder. Electrode 12A (which in this configuration is the drain electrode) is electrically connected to lead 203A with connective structure 206, such as a conductive clip. Electrode 12B, which is electrically connected to through-semiconductor vias 28B and gate pad 28A, is electrically connected to lead 203B with connective structure 207, such as a wire bond or a ribbon bond. In this example, electrode 12B is the gate electrode electrically connected to lead 203B.

In some examples, sub-assembly 200 can be encapsulated with a package body (note shown) with portions of leads 203A and 203B and die pad 202 exposed for electrically connecting to another level of assembly, such as a printed circuit board. In accordance with the present description, sub-assembly 200 is in a drain and gate up configuration with a source-down configuration. In the present vertical MOSFET example, lead 203A corresponds to a drain lead, lead 203B corresponds to a gate lead, and die pad 202 corresponds to a source lead.

Figure 17:
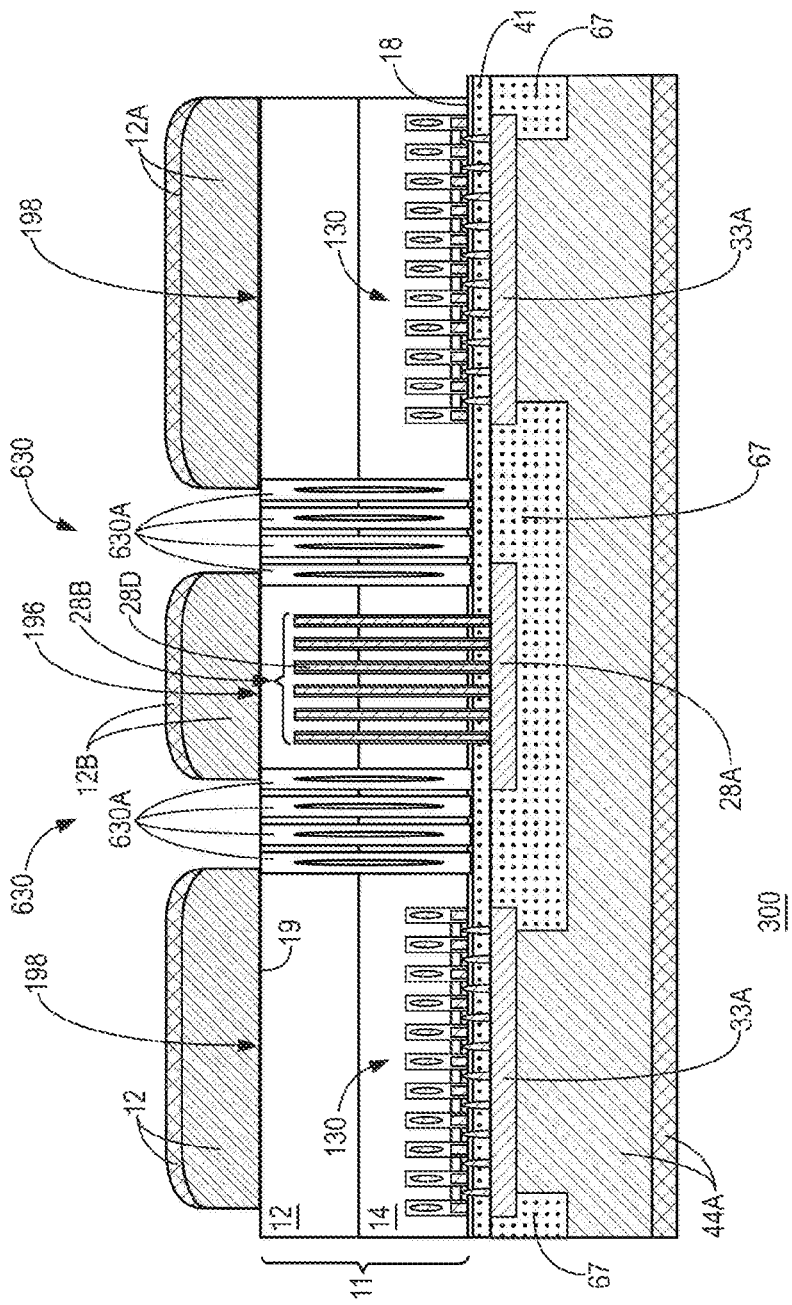
FIG. 17 illustrates a cross-sectional view of a semiconductor device at a stage of fabrication in accordance with the present description.

FIG. 17 illustrates a cross-sectional view of an electronic device 300, a semiconductor device 300, or semiconductor structure 300 having a source-down configuration in accordance with the present description. In the present example, semiconductor device 300 is a vertical MOSFET device, but it is understood that other types have devices can be used including, but not limited to IGBT devices and MOS-gated thyristors. Semiconductor device 300 is similar to semiconductor device 10 and only certain differences will be described. In semiconductor device 300, isolation structure 63 that is around through-semiconductor vias 28B comprises a wide isolation ring 630, which surrounds through-semiconductor vias 28B. In some examples, isolation ring 630 comprises a plurality of isolation portions 630A, which can be individual rings, interdigitated structures, structures with varied shapes, or other structures that provide electrical isolation between through-semiconductor vias 28B and source regions 33 and drain region 198. In other examples, plurality of isolation portions 630A further comprise shapes and materials that reduce stress caused by coefficient of thermal expansion mismatch between isolation ring 630 and region of semiconductor material 11. Isolation portions 630A can comprise similar materials as described for isolation portions 63A, 63B, and 63C. In semiconductor device 300, optional dielectric material 28E may be excluded.

Figure 18:
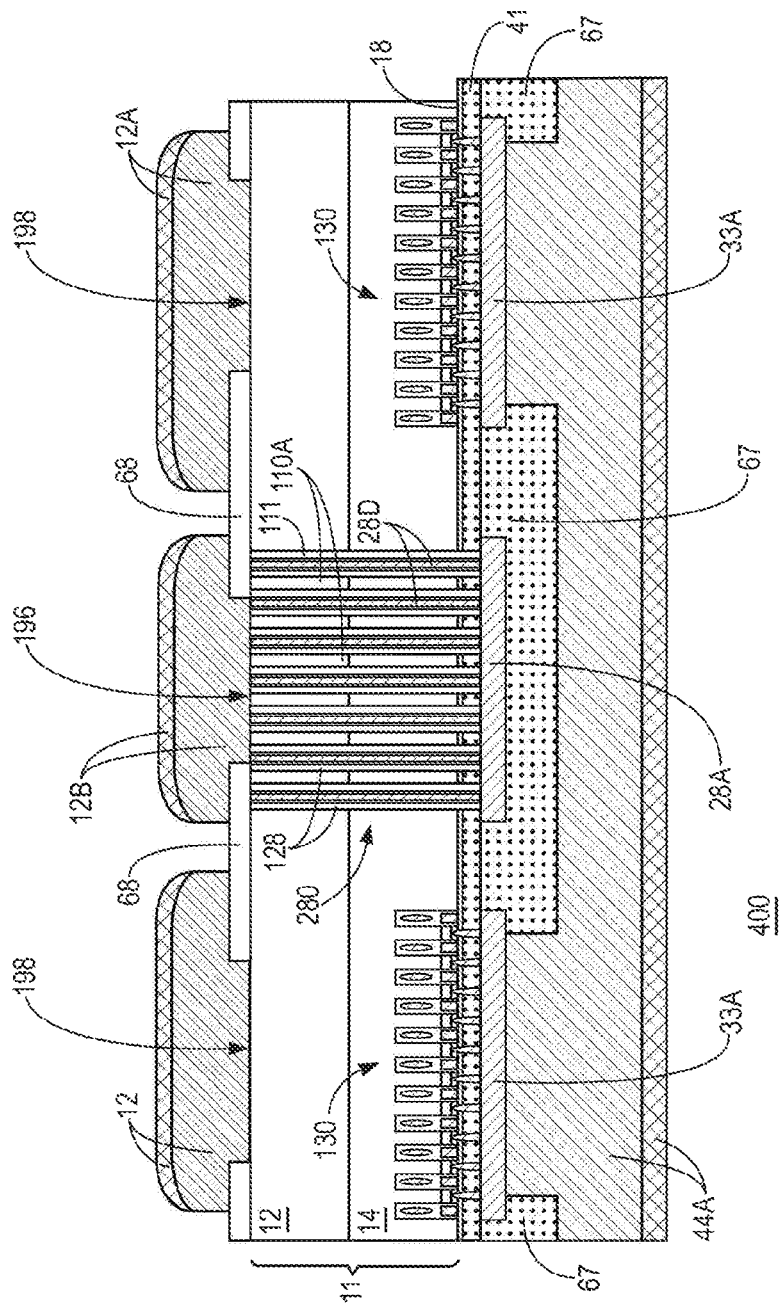
FIG. 18 illustrates a cross-sectional view of a semiconductor device at a stage of fabrication in accordance with the present description.

FIG. 18 illustrates a cross-sectional view of an electronic device 400, a semiconductor device 400, or semiconductor structure 400 having a source-down configuration in accordance with the present description. In the present example, semiconductor device 400 is a vertical MOSFET device, but it is understood that other types have devices can be used including, but not limited to IGBT devices and MOS-gated thyristors. Semiconductor device 400 is similar to semiconductor device 10 and only certain differences will be described. In semiconductor device 400, a through-semiconductor structure is used that comprises a ring isolated through-semiconductor via structure 280, which can comprise a recessed region etched through region of semiconductor material 11, which leaves portions 110A of region of semiconductor material 11 in place in a desired pattern. In some examples, a dielectric 128 is provided along sidewalls of portions 110A, a fill material 28D is then provided adjacent to dielectric 128. Fill material 28D can be similar to other fill materials as described previously. Dielectric 128 can be an oxide, a nitride, an oxy-nitride, an organic dielectric, other dielectric materials as known to one of ordinary skill in the art, or combinations thereof. In some examples, a recess that comprises portions 110A within it can be formed using photo-masking and etching techniques, for example using a fluorine based chemistry. As illustrated in FIG. 18, dielectric 128 can extend the entire vertical extent of region of semiconductor material 11 between major surface 18 and major surface 19.

In some examples, the outermost part 111 of portions 110A is in the shape of a ring that surrounds the rest of the structure, and dielectric 128 provided along the ring isolates fill material 28D from other portions of semiconductor device 400. As illustrated in FIG. 18, fill material 28D is exposed proximate to major surface 18 and major surface 19 to provide electrical communication between gate pad 28A (e.g., first gate conductor) and electrode 12B (e.g., second gate conductor). Other parts of portions 110A within the ring can have varied shapes, such as pillar-shapes, S-shapes, L-shapes, interdigitated shapes, or other shapes. In some examples, ring isolated through-semiconductor via structure 280 extends completely through region of semiconductor material 11 to directly connect to electrode 12B at major surface 19 of semiconductor device 400. In other examples, ring isolated through-semiconductor via structure 280 can terminate within region of semiconductor material 11. In such examples, recesses 19A can be used. In other examples, the dopant within substrate 12 adjacent to major surface 19 can be high enough to provide ohmic contact.

Figure 19:
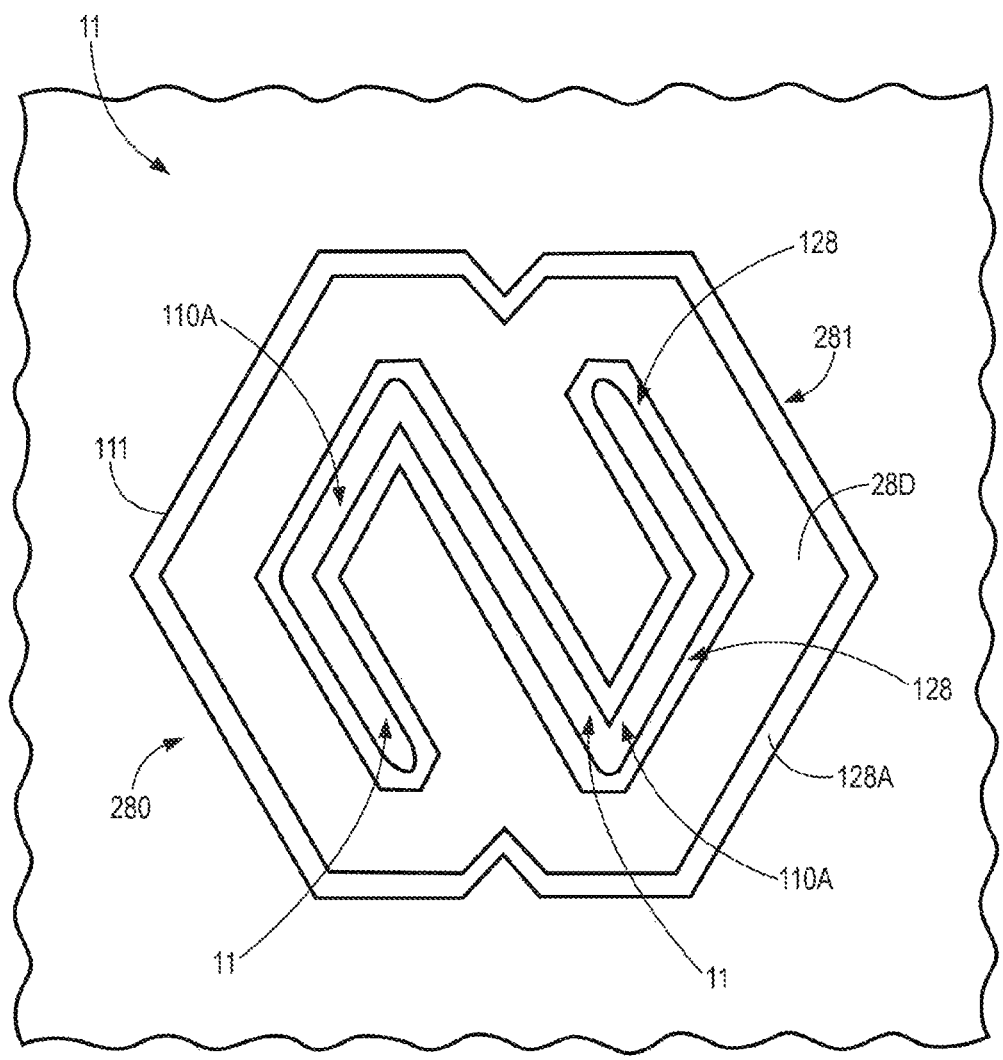
FIG. 19 illustrates a plan view of a ring isolated through-semiconductor via for use with a semiconductor device in accordance with the present description.

FIG. 19 is a plan view of a ring isolated through-semiconductor via structure 280 suitable for semiconductor device 400. Ring isolated through-semiconductor via structure 280 is another example of a conductive structure. The plan view can be at either at first major surface 18 or at second major surface 19 of region of semiconductor material 11. Ring isolated through-semiconductor via structure 280 comprises an outer ring portion 281 at the outermost part 111 that defines the outer perimeter of structure 280. Outer ring portion 281 further includes a dielectric ring 128A or ring of dielectric material 128A along the sidewall surface of region of semiconductor material 11. The outer perimeter, which includes dielectric ring 128A, laterally surrounds fill material 28D. In the present example, portion 110A comprises an S-shape in the plan view. As stated previously, portion 110A comprises a portion of region of semiconductor material 11. Dielectric 128 is adjacent to the sidewall of outer ring portion 281 as dielectric ring 128A and along the sidewall(s) portion 110A, and fill material 28D is adjacent to dielectric 128/128A. As illustrated in FIG. 18, fill material 28D is exposed proximate to major surface 18 and major surface 19 to provide electrical communication between gate pad 28A (e.g., first gate conductor) and electrode 12B (e.g., second gate conductor).

In view of all of the above, it is evident that a novel structure and method are disclosed. Included, among other features, is a semiconductor wafer having a first side and a second side. Active device structures are at the first side. A first gate conductor is at the first side and a second gate conductor is at the second side. A conductive structure electrically connects the first gate conductor to the second gate conductor. In some examples, an isolation structure electrically isolates the conductive structure from other parts of the semiconductor wafer. In some examples, the isolation structure provides an end point detection structure when removing part of the semiconductor wafer. In some examples, the isolation structure provides an alignment structure for forming opening in a dielectric at the second side. In some examples, the method using a plasma etching process to singulate the semiconductor wafer and a second singulation process to separate a source conductor at the first side. In some examples, this multi-step singulation process provides a solder dam structure that reduces the likelihood for electrical shorting failures. The structure and method provide a source-down configuration that can utilize a typical source-up process flow, and adds as few as two (2) photo-masking steps to provide the source-down configuration. In some examples, the source-down configuration enables stacked die structures and eliminates the need for an extra gate lead in packaging.

While the subject matter of the invention is described with specific preferred examples, the foregoing drawings and descriptions thereof depict only typical examples of the subject matter, and are not therefore to be considered limiting of its scope. It is evident that many alternatives and variations will be apparent to those skilled in the art. For example, the fill materials can comprise combinations of materials that may be deposited individually and annealed deposited as a plurality of layers and annealed as a composite structure. Various deposition techniques can be used for the fill materials, including sputtering, plating, evaporation, CVD, LPCVD, PECVD, MOCVD, ALD as well as other deposition techniques known to one of ordinary skill in the art.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the invention. Furthermore, while some examples described herein include some but not other features included in other examples, combinations of features of different examples are meant to be within the scope of the invention and meant to form different examples as would be understood by those skilled in the art.

What is claimed is:

1. A method of forming a semiconductor device, comprising:
   providing a semiconductor wafer having a first side and a second side opposite to the first side and semiconductor devices, wherein each semiconductor device comprises a gate pad and active device structures including source regions and gate electrodes adjacent to the first side, and a drain region and a gate region at the second side, and wherein the gate pad is electrically coupled to the gate electrodes;
   providing a conductive structure extending from the gate pad at least partially through the semiconductor wafer towards the second side to electrically couple the gate pad to the gate region at the second side;
   providing a first electrode over the first side electrically coupled to the source regions and electrically isolated from the gate pad;
   providing a second electrode at the second side adjacent to the gate region and electrically coupled to the conductive structure; and
   providing a third electrode electrically coupled to the drain region at the second side.

2. The method of claim 1, further comprising:
   plasma etching the semiconductor wafer from the second side towards the front side while the semiconductor wafer is attached to a carrier substrate to provide first singulation lines; and
   removing portions of semiconductor wafer through the first singulation lines to provide second singulation lines to separate the first conductor.

3. The method of claim 2, wherein:
   the removing step comprises sawing.

4. The method of claim 2, wherein:
   the removing step comprises laser processing.

5. The method of claim 2, wherein:
   the first singulation lines are wider than the second singulation lines.

6. The method of claim 5, wherein:
   the plasma etching step and the removing step form a solder dam structure for each semiconductor device.

7. The method of claim 1, further comprising:
   providing an isolation structure, wherein the isolation structure electrically isolates the conductive structure from the source regions and the drain region;
   providing a dielectric over the gate pad to electrically isolate the gate pad from the first electrode; and
   removing part of the second side using the isolation structure for endpoint detection.

8. The method of claim 1, wherein:
   providing the conductive structure comprises providing through-semiconductor vias comprising a conductive fill material.

9. The method of claim 1, wherein:
   providing the conductive structure comprises providing the conductive structure partially extending through the semiconductor wafer so that a part of the semiconductor wafer is interposed between a proximate end of the conductive structure and the second electrode.

10. The method of claim 1, wherein:
providing the conductive structure comprises providing the conductive structure extending all the way through the semiconductor wafer; and
a proximate end of the conductive structure directly contacts the third electrode.

11. The method of claim 1, wherein:
providing the conductive structure comprises providing the conductive structure comprising a dielectric ring surrounding a conductive fill material.

\* \* \* \* \*